(12) United States Patent
Sandhu et al.

(10) Patent No.: US 7,776,744 B2
(45) Date of Patent: Aug. 17, 2010

(54) PITCH MULTIPLICATION SPACERS AND METHODS OF FORMING THE SAME

(75) Inventors: Gurtej S. Sandhu, Boise, ID (US); Kirk D. Prall, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 108 days.

(21) Appl. No.: 11/219,346

(22) Filed: Sep. 1, 2005

(65) Prior Publication Data

US 2007/0049030 A1  Mar. 1, 2007

(51) Int. Cl.
*H01L 21/302* (2006.01)
*H01L 21/461* (2006.01)

(52) U.S. Cl. .............. 438/689; 438/396; 438/669; 438/696; 438/694

(58) Field of Classification Search ............... 438/694, 438/689, 669, 696, 396
See application file for complete search history.

(56) References Cited

U.S. PATENT DOCUMENTS

| | | | |
|---|---|---|---|
| 4,234,362 A | 11/1980 | Riseman | |
| 4,419,809 A | 12/1983 | Riseman et al. | |
| 4,432,132 A | 2/1984 | Kinsbron et al. | |
| 4,502,914 A | 3/1985 | Trumpp et al. | |
| 4,508,579 A | 4/1985 | Goth et al. | |
| 4,570,325 A | 2/1986 | Higuchi | |
| 4,648,937 A | 3/1987 | Ogura et al. | |
| 4,716,131 A | 12/1987 | Okazawa et al. | |
| 4,776,922 A | 10/1988 | Bhattacharyya et al. | |
| 4,838,991 A | 6/1989 | Cote et al. | |
| 5,013,680 A | 5/1991 | Lowrey et al. | |
| 5,047,117 A | 9/1991 | Roberts | |
| 5,053,105 A | 10/1991 | Fox, III | |
| 5,117,027 A | 5/1992 | Bernhardt et al. | |
| 5,328,810 A | 7/1994 | Lowrey et al. | |
| 5,330,879 A | 7/1994 | Dennison | |
| 5,470,661 A | 11/1995 | Bailey et al. | |
| 5,514,885 A | 5/1996 | Myrick | |

(Continued)

FOREIGN PATENT DOCUMENTS

DE   280851   7/1990

(Continued)

OTHER PUBLICATIONS

Choi et al. (Journal of Vacuum Technology, B 21(6), Dec. 12, 2003, (pp. 2951-2955)).*

(Continued)

*Primary Examiner*—Shamim Ahmed
*Assistant Examiner*—Mahmoud Dahimene
(74) *Attorney, Agent, or Firm*—Knobbe, Martens, Olson & Bear LLP

(57) ABSTRACT

Spacers in a pitch multiplication process are formed without performing a spacer etch. Rather, the mandrels are formed over a substrate and then the sides of the mandrels are reacted, e.g., in an oxidization, nitridation, or silicidation step, to form a material that can be selectively removed relative to the unreacted portions of the mandrel. The unreacted portions are selectively removed to leave a pattern of free-standing spacers. The free-standing spacers can serve as a mask for subsequent processing steps, such as etching the substrate.

15 Claims, 21 Drawing Sheets

U.S. PATENT DOCUMENTS

| | | | |
|---|---|---|---|
| 5,628,917 A * | 5/1997 | MacDonald et al. | 216/2 |
| 5,670,794 A | 9/1997 | Manning | |
| 5,677,217 A * | 10/1997 | Tseng | 437/45 |
| 5,753,546 A | 5/1998 | Koh et al. | |
| 5,789,320 A | 8/1998 | Andricacos et al. | |
| 5,795,830 A | 8/1998 | Cronin et al. | |
| 5,830,332 A | 11/1998 | Babich et al. | |
| 5,899,746 A | 5/1999 | Mukai | |
| 5,998,256 A | 12/1999 | Juengling | |
| 6,004,862 A | 12/1999 | Kim et al. | |
| 6,010,946 A | 1/2000 | Hisamune et al. | |
| 6,042,998 A | 3/2000 | Brueck et al. | |
| 6,057,573 A | 5/2000 | Kirsch et al. | |
| 6,063,688 A | 5/2000 | Doyle et al. | |
| 6,071,789 A | 6/2000 | Yang et al. | |
| 6,110,837 A | 8/2000 | Linliu et al. | |
| 6,143,476 A | 11/2000 | Ye et al. | |
| 6,211,044 B1 | 4/2001 | Xiang et al. | |
| 6,288,454 B1 | 9/2001 | Allman et al. | |
| 6,291,334 B1 | 9/2001 | Somekh | |
| 6,297,554 B1 | 10/2001 | Lin | |
| 6,335,257 B1 | 1/2002 | Tseng | |
| 6,348,380 B1 | 2/2002 | Weimer et al. | |
| 6,362,057 B1 | 3/2002 | Taylor, Jr. et al. | |
| 6,383,907 B1 | 5/2002 | Hasegawa et al. | |
| 6,395,613 B1 | 5/2002 | Juengling | |
| 6,423,474 B1 | 7/2002 | Holscher | |
| 6,455,372 B1 | 9/2002 | Weimer | |
| 6,475,867 B1 | 11/2002 | Hui et al. | |
| 6,500,756 B1 | 12/2002 | Bell et al. | |
| 6,514,884 B2 | 2/2003 | Maeda | |
| 6,522,584 B1 | 2/2003 | Chen et al. | |
| 6,534,243 B1 * | 3/2003 | Templeton et al. | 430/312 |
| 6,548,396 B2 | 4/2003 | Naik et al. | |
| 6,559,017 B1 | 5/2003 | Brown et al. | |
| 6,566,280 B1 | 5/2003 | Meagley et al. | |
| 6,573,030 B1 | 6/2003 | Fairbairn et al. | |
| 6,602,779 B1 | 8/2003 | Li et al. | |
| 6,632,741 B1 | 10/2003 | Clevenger et al. | |
| 6,638,441 B2 | 10/2003 | Chang et al. | |
| 6,667,237 B1 | 12/2003 | Metzler | |
| 6,673,684 B1 | 1/2004 | Huang et al. | |
| 6,686,245 B1 | 2/2004 | Mathew et al. | |
| 6,689,695 B1 | 2/2004 | Lui et al. | |
| 6,706,571 B1 | 3/2004 | Yu et al. | |
| 6,709,807 B2 | 3/2004 | Hallock et al. | |
| 6,734,107 B2 | 5/2004 | Lai et al. | |
| 6,744,094 B2 | 6/2004 | Forbes | |
| 6,773,998 B1 | 8/2004 | Fisher et al. | |
| 6,794,699 B2 | 9/2004 | Bissey et al. | |
| 6,800,930 B2 | 10/2004 | Jackson et al. | |
| 6,835,662 B1 | 12/2004 | Erhardt et al. | |
| 6,867,116 B1 | 3/2005 | Chung | |
| 6,875,703 B1 | 4/2005 | Furukawa et al. | |
| 6,893,972 B2 | 5/2005 | Rottstegge et al. | |
| 6,924,191 B2 | 8/2005 | Liu et al. | |
| 6,955,961 B1 | 10/2005 | Cheng | |
| 6,962,867 B2 | 11/2005 | Jackson et al. | |
| 7,015,124 B1 | 3/2006 | Fisher et al. | |
| 7,084,076 B2 | 8/2006 | Park et al. | |
| 7,169,678 B2 * | 1/2007 | Kim | 438/303 |
| 7,183,205 B2 | 2/2007 | Hong | |
| 7,183,597 B2 | 2/2007 | Doyle | |
| 7,208,379 B2 | 4/2007 | Venugopal et al. | |
| 7,271,107 B2 | 9/2007 | Marks et al. | |
| 7,288,445 B2 | 10/2007 | Bryant et al. | |
| 2001/0005631 A1 | 6/2001 | Kim et al. | |
| 2002/0042198 A1 | 4/2002 | Bjarnason et al. | |
| 2002/0045308 A1 | 4/2002 | Juengling | |
| 2002/0063110 A1 | 5/2002 | Cantell et al. | |
| 2002/0068243 A1 | 6/2002 | Hwang et al. | |
| 2002/0127810 A1 | 9/2002 | Nakamura et al. | |
| 2003/0006410 A1 | 1/2003 | Doyle | |
| 2003/0044722 A1 | 3/2003 | Hsu et al. | |
| 2003/0109102 A1 | 6/2003 | Kujirai et al. | |
| 2003/0113987 A1 * | 6/2003 | Hayamizu | 438/585 |
| 2003/0119307 A1 | 6/2003 | Bekiaris et al. | |
| 2003/0127426 A1 | 7/2003 | Chang et al. | |
| 2003/0157436 A1 * | 8/2003 | Manger et al. | 430/311 |
| 2003/0207207 A1 | 11/2003 | Li | |
| 2003/0207584 A1 | 11/2003 | Sivakumar et al. | |
| 2003/0215978 A1 | 11/2003 | Maimon et al. | |
| 2003/0216050 A1 | 11/2003 | Golz et al. | |
| 2003/0230234 A1 | 12/2003 | Nam et al. | |
| 2004/0000534 A1 | 1/2004 | Lipinski | |
| 2004/0017989 A1 | 1/2004 | So | |
| 2004/0018738 A1 | 1/2004 | Liu | |
| 2004/0023475 A1 | 2/2004 | Bonser et al. | |
| 2004/0023502 A1 | 2/2004 | Tzou et al. | |
| 2004/0041189 A1 | 3/2004 | Voshell et al. | |
| 2004/0043623 A1 | 3/2004 | Liu et al. | |
| 2004/0053475 A1 | 3/2004 | Sharma | |
| 2004/0079988 A1 | 4/2004 | Harari | |
| 2004/0106257 A1 | 6/2004 | Okamura et al. | |
| 2004/0235255 A1 | 11/2004 | Tanaka et al. | |
| 2005/0064691 A1 | 3/2005 | Kim | |
| 2005/0074949 A1 | 4/2005 | Jung et al. | |
| 2005/0112886 A1 | 5/2005 | Asakawa et al. | |
| 2005/0142497 A1 | 6/2005 | Ryou et al. | |
| 2005/0153562 A1 | 7/2005 | Furukawa et al. | |
| 2005/0164454 A1 | 7/2005 | Leslie | |
| 2005/0167394 A1 | 8/2005 | Liu et al. | |
| 2005/0186705 A1 | 8/2005 | Jackson et al. | |
| 2005/0272259 A1 * | 12/2005 | Hong | 438/669 |
| 2006/0003182 A1 | 1/2006 | Lane et al. | |
| 2006/0024940 A1 | 2/2006 | Furukawa et al. | |
| 2006/0046161 A1 | 3/2006 | Yin et al. | |
| 2006/0046200 A1 | 3/2006 | Abatchev et al. | |
| 2006/0046201 A1 | 3/2006 | Sandhu et al. | |
| 2006/0046422 A1 | 3/2006 | Tran et al. | |
| 2006/0046484 A1 | 3/2006 | Abatchev et al. | |
| 2006/0083996 A1 | 4/2006 | Kim | |
| 2006/0105537 A1 * | 5/2006 | Nam et al. | 438/396 |
| 2006/0172540 A1 | 8/2006 | Marks et al. | |
| 2006/0180866 A1 * | 8/2006 | Zhu et al. | 257/368 |
| 2006/0189150 A1 | 8/2006 | Jung | |
| 2006/0211260 A1 | 9/2006 | Tran et al. | |
| 2006/0216923 A1 | 9/2006 | Tran et al. | |
| 2006/0231900 A1 | 10/2006 | Lee et al. | |
| 2006/0234138 A1 | 10/2006 | Fehlhaber et al. | |
| 2006/0263699 A1 | 11/2006 | Abatchev et al. | |
| 2006/0267075 A1 | 11/2006 | Sandhu et al. | |
| 2006/0273456 A1 | 12/2006 | Sant et al. | |
| 2006/0281266 A1 | 12/2006 | Wells | |
| 2007/0026672 A1 | 2/2007 | Tang et al. | |
| 2007/0045712 A1 | 3/2007 | Haller et al. | |
| 2007/0048674 A1 | 3/2007 | Wells | |
| 2007/0049011 A1 | 3/2007 | Tran | |
| 2007/0049030 A1 | 3/2007 | Sandhu et al. | |
| 2007/0049032 A1 | 3/2007 | Abatchev et al. | |
| 2007/0049035 A1 | 3/2007 | Tran | |
| 2007/0049040 A1 | 3/2007 | Bai et al. | |
| 2007/0050748 A1 | 3/2007 | Juengling | |
| 2007/0215874 A1 | 9/2007 | Furukawa et al. | |
| 2007/0215960 A1 | 9/2007 | Zhu et al. | |
| 2008/0054350 A1 | 3/2008 | Breitwisch et al. | |

FOREIGN PATENT DOCUMENTS

| | | |
|---|---|---|
| DE | 42 36 609 A1 | 5/1994 |
| DE | 4236609 A1 | 5/1994 |
| EP | 0227303 | 7/1987 |
| EP | 0491408 | 6/1992 |
| EP | 1357433 | 10/2003 |

| | | |
|---|---|---|
| JP | 05343370 | 12/1993 |
| JP | H8-55908 | 2/1996 |
| JP | H8-55920 | 2/1996 |
| KR | 1999-0001440 | 1/1999 |
| KR | 1999-027887 | 4/1999 |
| TW | 200408125 | 5/2004 |
| TW | 200408129 | 5/2004 |
| WO | WO 94/15261 | 7/1994 |
| WO | WO 02/099864 A1 | 12/2002 |
| WO | WO 2004/001799 A2 | 12/2003 |
| WO | WO 2004/003977 A2 | 1/2004 |
| WO | WO 2005/010973 | 2/2005 |
| WO | WO 2005/034215 A1 | 4/2005 |
| WO | WO 2006-026699 | 3/2006 |

OTHER PUBLICATIONS

"U.S. Appl. No. 11/543,515, filed Oct. 24, 2006, MICRON Ref. No. 2005-1173.00/US."

Ex Parte Cantell, unpublished decision of the Board of Patent Appeals and Interferences, Mar. 4, 2005.

Bergeron, et al., "Resolution Enhancement Techniques for the 90nm Technology Node and Beyond," Future Fab International, Issue 15, Jul. 11, 2003, 4 pages.

Brave et al., "Developer-soluble Gap fill materials for patterning metal trenches in Via-first Dual Damascene process," preprint of Proceedings of SPIE: Advances in Resist Technology and Processing XXI, vol. 5376, John L. Sturtevant, editor, 2004, 8 pages.

Chung et al., "Pattern multiplication method and the uniformity of nanoscale multiple lines," J.Vac.Sci.Technol. B21(4), Jul./Aug. 2003, pp. 1491-1495.

Chung et al., "Nanoscale Multi-Line Patterning Using Sidewall Structure," Jpn., J. App.. Phys. vol. 41 (2002) Pt. 1, No. 6B, pp. 4410-4414.

Joubert et al., "Nanometer scale linewidth control during etching of polysilicon gates in high-density plasmas," Microelectronic Engineering 69 (2003), pp. 350-357.

Oehrlein et al., "Pattern transfer into low dielectic materials by high-density plasma etching," Solid State Tech., May 2000, 8 pages.

Choi et al., "Sublithographic nanofabrication technology for nanocatalysts and DNA chips," *J. Vac. Sci. Technol.*, pp. 2951-2955 (Nov./Dec. 2003).

Bruek, S.R.J., "Optical and interferometric lithography—Nanotechnology enablers," *Proceedings of the IEEE*, vol. 93, No. 10, Oct. 2005, pp. 1704-1721.

Sheats et al., "Microlithography: Science and Technology," *Marcel Dekkar, Inc.*, pp. 104-105 (1998).

U.S. Office Action issued Jun. 2, 2008 in U.S. Appl. No. 11/219,067, filed Sep. 1, 2005.

U.S. Office Action issued Jun. 5, 2008 in U.S. Appl. No. 11/514,117, filed Aug. 30, 2006.

U.S. Office Action issued Jul. 11, 2008 in U.S. Appl. No. 11/367,020, filed Mar. 2, 2006.

* cited by examiner

PITCH MULTIPLICATION SPACERS AND METHODS OF FORMING THE SAME

CROSS-REFERENCE TO RELATED APPLICATIONS

This application is related to the following: U.S. patent application Ser. No. 10/934,778 to Abatchev et al., filed Sep. 2, 2004, entitled Method for Integrated Circuit Fabrication Using Pitch Multiplication; and U.S. Patent Provisional Application No. 60/662,323 to Tran et al, filed Mar. 15, 2005, entitled Pitch Reduced Patterns Relative To Photolithography Features.

BACKGROUND OF THE INVENTION

1. Field of the Invention

This invention relates generally to integrated circuit fabrication and more particularly, to masking techniques.

2. Description of the Related Art

As a consequence of many factors, including demand for increased portability, computing power, memory capacity and energy efficiency, integrated circuits are continuously being made more dense. The sizes of the constituent features that form the integrated circuits, e.g., electrical devices and interconnect lines, are constantly being decreased to facilitate this scaling.

The trend of decreasing feature size is evident, for example, in memory circuits or devices such as dynamic random access memories (DRAMs), flash memory, static random access memories (SRAMs), ferroelectric (FE) memories, etc. These memory devices typically comprise millions of identical circuit elements, known as memory cells. A capacitor-based memory cell, such as in conventional DRAM, typically consists of two electrical devices: a storage capacitor and an access field effect transistor. Each memory cell is an addressable location that can store one bit (binary digit) of data. A bit can be written to a cell through the transistor and can be read by sensing charge in the capacitor. Some memory technologies employ elements that can act as both a storage device and a switch (e.g., dendritic memory employing silver-doped chalcogenide glass) and some non-volatile memories do not require switches for each cell (e.g., magnetoresistive RAM). In general, by decreasing the sizes of the electrical devices that constitute a memory cell and the sizes of the conducting lines that access the memory cells, the memory devices can be made smaller. Additionally, storage capacities can be increased by fitting more memory cells on a given area in the memory devices.

The continual reduction in feature sizes places ever greater demands on the techniques used to form the features. For example, photolithography is commonly used to pattern features, such as conductive lines. The concept of pitch can be used to describe the sizes of these features when the pattern includes repeating features, as in arrays. Pitch is defined as the distance between an identical point in two neighboring features. These features are typically defined by spaces between adjacent features, which spaces are typically filled by a material, such as an insulator. As a result, pitch can be viewed as the sum of the width of a feature and of the width of the space on one side of the feature separating that feature from a neighboring feature. However, due to factors such as optics and light or radiation wavelength, photolithography techniques each have a minimum pitch below which a particular photolithographic technique cannot reliably form features. Thus, the minimum pitch of a photolithographic technique is an obstacle to continued feature size reduction.

"Pitch doubling" or "pitch multiplication" is one method for extending the capabilities of photolithographic techniques beyond their minimum pitch. A pitch multiplication method is illustrated in FIGS. 1A-1F and described in U.S. Pat. No. 5,328,810, issued to Lowrey et al., the entire disclosure of which is incorporated herein by reference. With reference to FIG. 1A, a pattern of lines 10 is photolithographically formed in a photoresist layer, which overlies a layer 20 of an expendable material, which in turn overlies a substrate 30. As shown in FIG. 1B, the pattern is then transferred using an etch (preferably an anisotropic etch) to the layer 20, thereby forming placeholders, or mandrels, 40. The photoresist lines 10 can be stripped and the mandrels 40 can be isotropically etched to increase the distance between neighboring mandrels 40, as shown in FIG. 1C. A layer 50 of spacer material is subsequently deposited over the mandrels 40, as shown in FIG. 1D. Spacers 60, i.e., the material extending or originally formed extending from sidewalls of another material, are then formed on the sides of the mandrels 40. The spacer formation is accomplished by performing a spacer etch, i.e., by preferentially, directionally etching the spacer material from the horizontal surfaces 70 and 80, as shown in FIG. 1E. The remaining mandrels 40 are then removed, leaving behind only the spacers 60, which together act as a mask for patterning, as shown in FIG. 1F. Thus, where a given pitch previously included a pattern defining one feature and one space, the same width now includes two features and two spaces, with the spaces defined by, e.g., the spacers 60. As a result, the smallest feature size possible with a photolithographic technique is effectively decreased.

While the pitch is actually halved in the example above, this reduction in pitch is conventionally referred to as pitch "doubling," or, more generally, pitch "multiplication." Thus, conventionally, "multiplication" of pitch by a certain factor actually involves reducing the pitch by that factor. The conventional terminology is retained herein.

It will be appreciated that etch processes may remove different parts of a surface at different rates. For example, the trim etch of the mandrels 40 may etch the sidewalls of the mandrels 40 at varying rates across a substrate, due to local differences in temperatures that can cause local differences in etch rates. These non-uniformities can then be transferred to the spacers 60 formed on the sidewalls and, ultimately, lead to non-uniformities in features patterned in the substrate 30 using the spacers 60.

Moreover, the materials used to form the mandrels 40 should typically be compatible with various process steps, e.g., the materials are typically materials for which a suitable selective isotropic etch is available (to perform the trim etch) and for which suitable selective anisotropic etches are available for various pattern formation and pattern transfer steps (e.g., for transferring patterns from overlying resist). In turn, the material for the mandrels 40 can limit the choice of later-deposited materials, e.g., spacer materials, since the deposition conditions for the later-deposited materials should typically not adversely affect the mandrels 40. The requirement of the isotropic etch, in addition to the other requirements for compatible etches and deposited materials, can limit the choice of materials used in pitch multiplication, thereby limiting process latitude.

Accordingly, there is a need for methods for extending the capabilities of pitch multiplication.

SUMMARY OF THE INVENTION

According to one aspect of the invention, a method is provided for semiconductor processing. The method comprises providing a temporary feature over a substrate. The temporary feature comprises a first material. The first material is reacted with a chemical species to form a mask feature comprising the product of the reaction between the first material and the chemical species. Unreacted first material is subsequently selectively removed.

According to another aspect of the invention, a method is provided for forming a memory device. The method comprises defining a pattern in a selectively definable layer over a substrate. The pattern is transferred from the selectively definable layer to an underlying layer of temporary material to form a plurality of temporary placeholders in the layer of temporary material across a region over the substrate. Some of the temporary material is converted into an other material to form a plurality of spacers. The mask material forms a plurality of mask features and temporary material that is unconverted is selectively removed. The substrate is processed through a mask pattern defined by the plurality of spacers.

According to another aspect of the invention, a method is provided for forming an array of repeating features in an integrated circuit. The method comprises lithographically defining a plurality of resist features in a resist layer over a substrate to form a pattern. The resist features each have a width defined by lithographically. The pattern is transferred to a layer of mandrel material under the resist layer to form a plurality of mandrels on a level over the substrate. The mandrels each have a width substantially equal to a width of the resist features. A plurality of spacers is formed on the level of the mandrels without etching the mandrels after transferring the pattern. The distance between the spacers is less than the width of the mandrels. The pattern defined by the spacers is transferred to the substrate to form the array of repeating features.

According to yet another aspect of the invention, a method is provided method for fabricating an integrated circuit. The method comprises providing a mandrel in a region of the integrated circuit. A layer of material is deposited over the mandrel. The layer of material is isotropically etched to leave exposed spacers at the sides of the mandrel.

According to another aspect of the invention, an intermediate mask pattern overlying a partially fabricated integrated circuit is provided. The mask pattern comprises a plurality of spaced mandrels, which each have a cap layer overlying its top surface. A layer of pre-spacer material overlies each cap layer. The partially fabricated integrated circuit further comprises spacers on sides of each of the mandrel. The spacers comprise a combination of the pre-spacer material and the mandrel material. The pre-spacer material also extends between neighboring spacers.

BRIEF DESCRIPTION OF THE DRAWINGS

The invention will be better understood from the Detailed Description of the Preferred Embodiments and from the appended drawings, which are meant to illustrate and not to limit the invention, and wherein.

DETAILED DESCRIPTION OF THE PREFERRED EMBODIMENTS

Figure 1A:
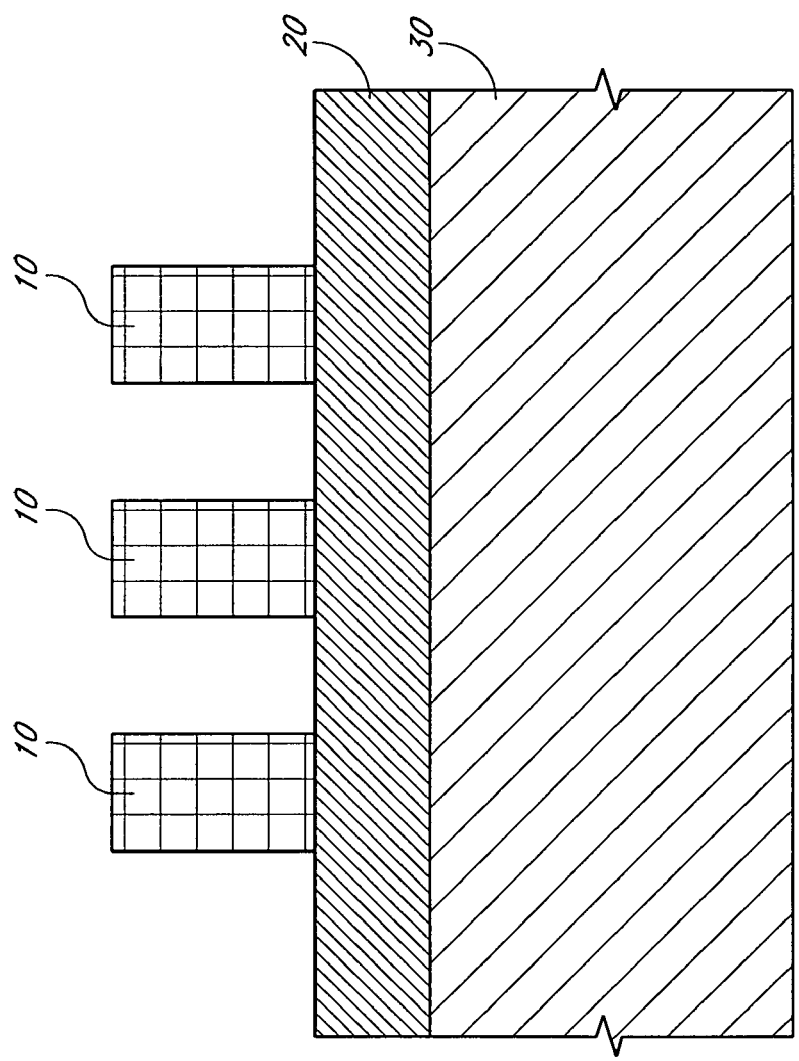
FIGS. 1A-1F are schematic, cross-sectional side views of a sequence of masking patterns for forming conductive lines, in accordance with a prior art pitch doubling method.
Figure 1B:
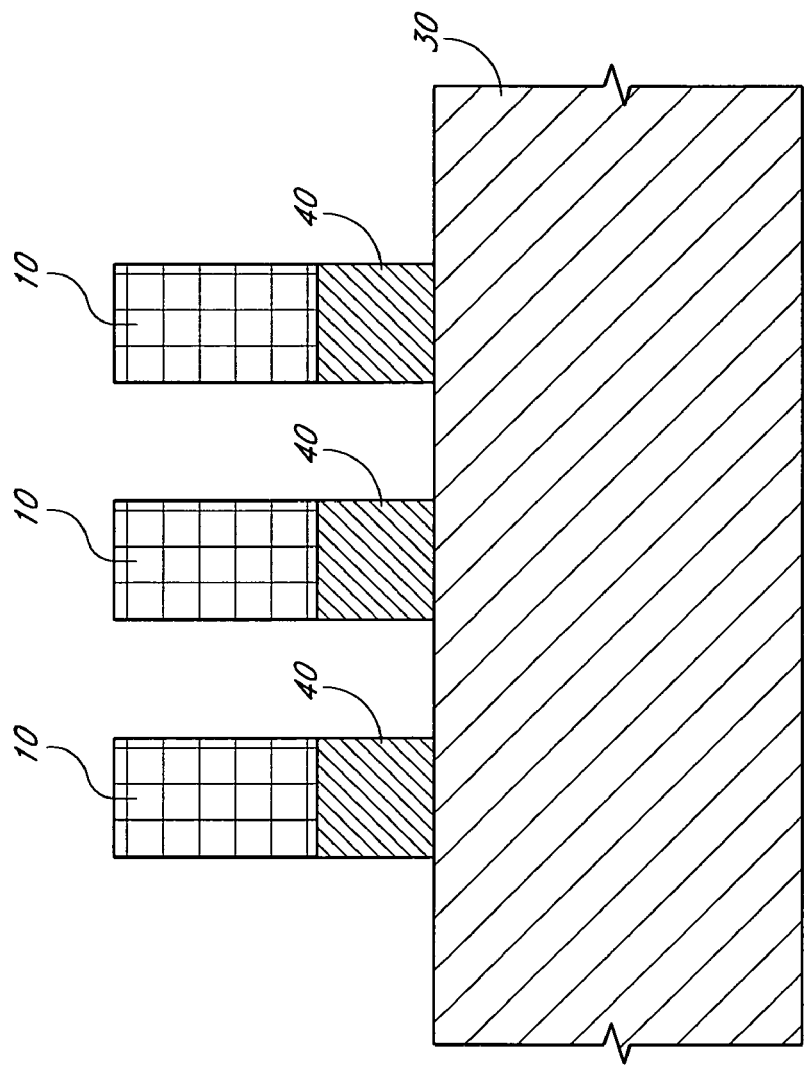
Figure 1C:
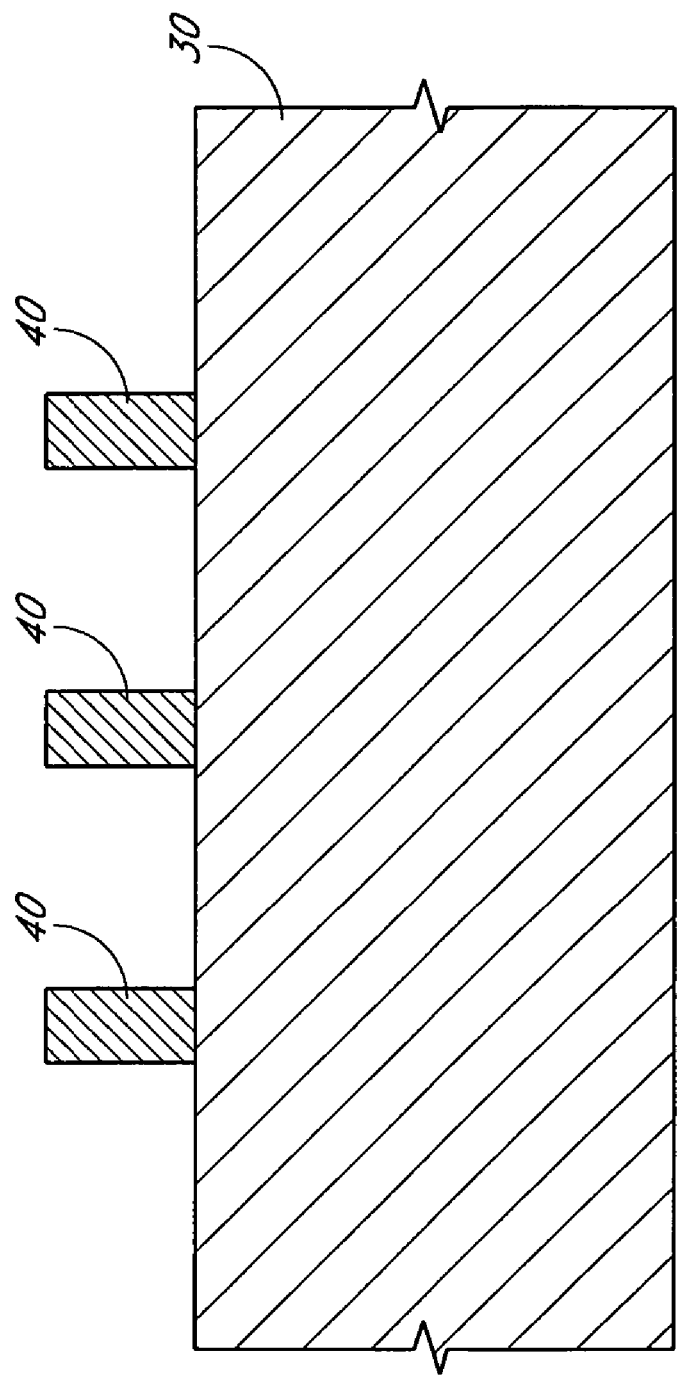
Figure 1D:
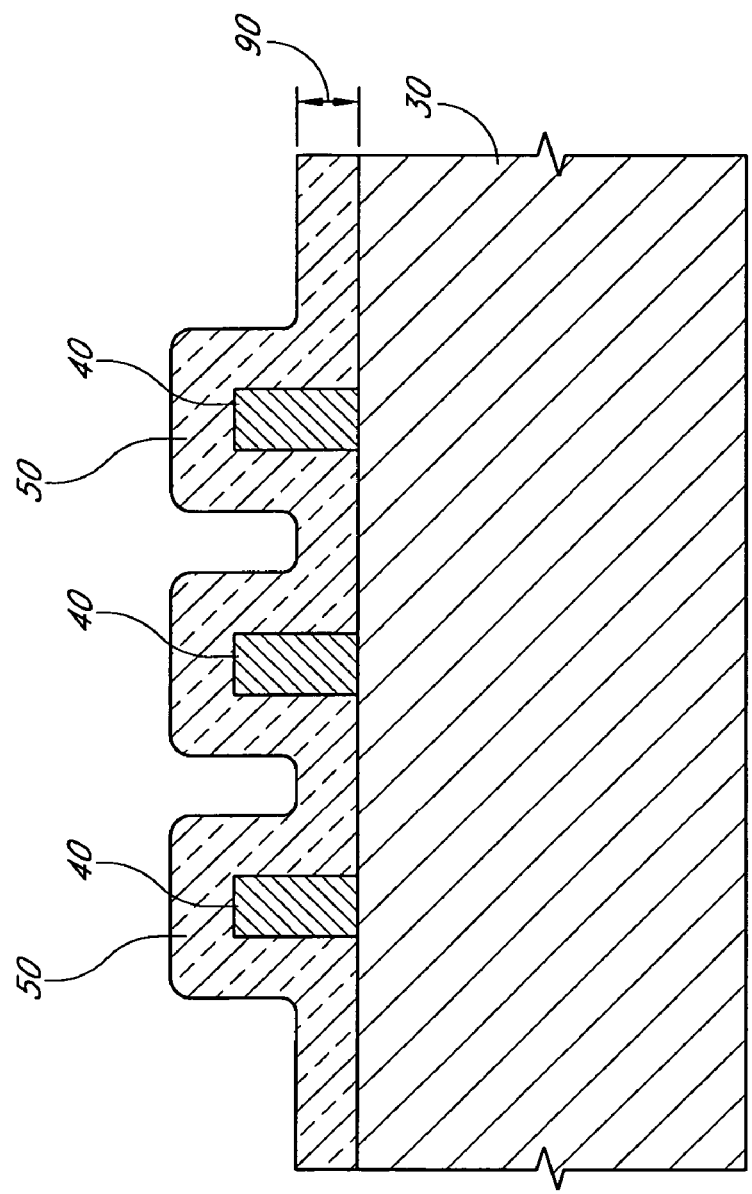
Figure 1E:
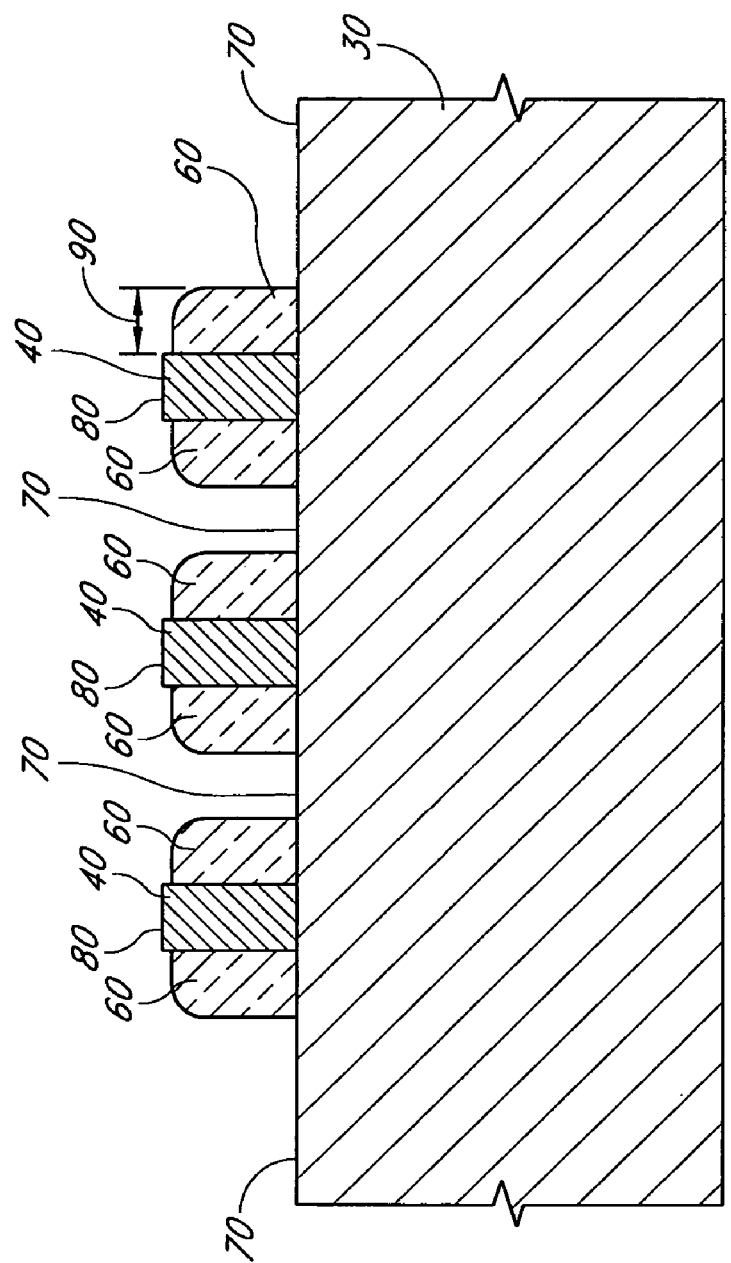
Figure 1F:
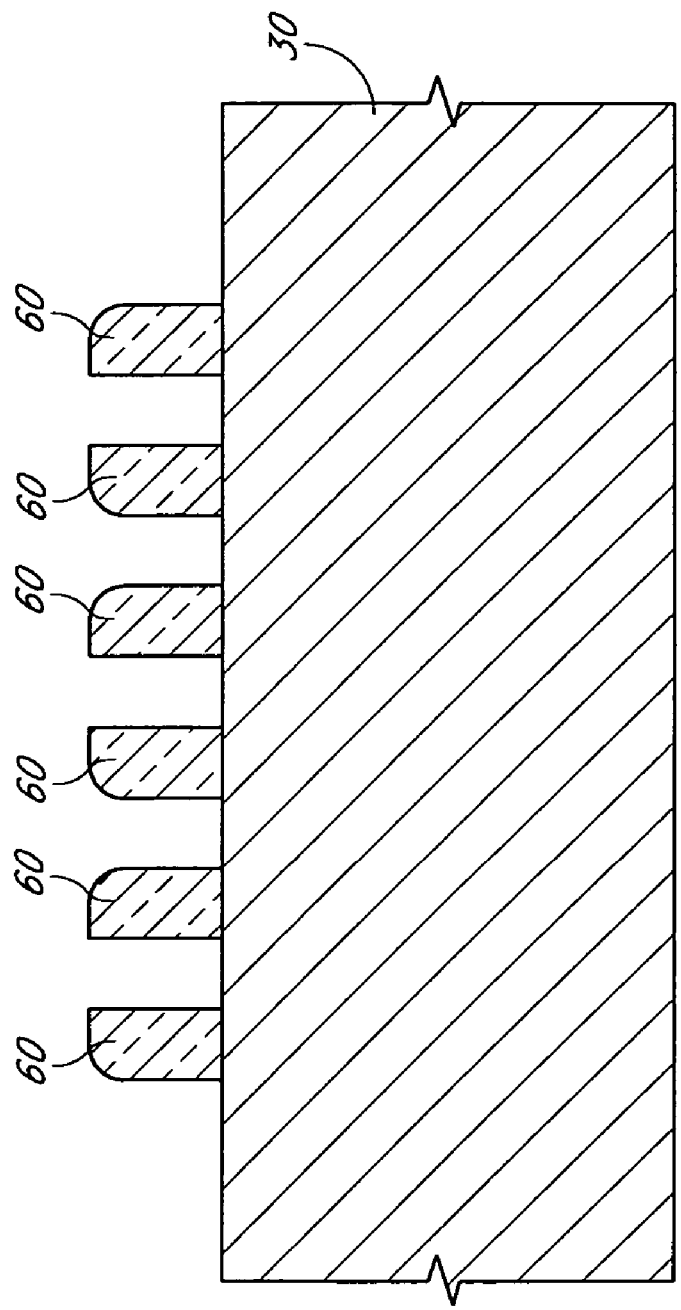

In preferred embodiments of the invention, in a masking process, mask features, such as spacers, are formed by a reaction with a temporary feature, such as a mandrel. Preferably, the spacers are formed at the sides of mandrels and a trim etch of the mandrels is not needed. The mandrels are preferably reacted with at least one other material or chemical species to form the spacers, which comprise spacer material that is a product of the reaction. A cap layer is preferably formed over the top, horizontal surface of the mandrels to inhibit reactions on that surface. Thus, the reactions preferably occur at the sides of the mandrels and convert the sidewall mandrel material into spacer material. Unreacted mandrel material is then preferably removed, to leave a pattern of free-standing spacers. Preferably, the spacers are formed without a spacer etch, i.e., without performing a directional etch that preferentially removes spacer material from horizontal surfaces. After removing the mandrel material, the pattern of free-standing spacers can be used in a mask for subsequently processing an underlying substrate.

The conversion of mandrel material into spacer material can be accomplished by various processes, including, e.g., oxidation, nitridation, silicidation and polymerization. For example, a layer of a material is formed on the sides the mandrels (e.g., by performing a conformal blanket deposition over the mandrels) and the mandrels are made to react with that layer of material by, e.g., performing an anneal. In other embodiments, the mandrels can be exposed to one or more gaseous reactants to form the spacer material, or the mandrels can be exposed to energy (e.g., light) or other agents (e.g., catalysts) to convert the exposed mandrel material into another material by, e.g., polymerizing or cross-linking the exposed sidewalls of the mandrel material.

Advantageously, because the spacers are formed by converting part of the mandrels into spacer material, a trim of the mandrels is not necessary. The spacers are formed extending into the mandrels and, thus, can be made closer together than would be the case if the spacers were formed on the sidewalls of the mandrels. The extent of the spacer formation reaction can influence both the thickness of the spacers and the spacing therebetween. Advantageously, the spacer separation can be similar to the separation achieved after performing a mandrel trim etch in a typical pitch multiplication process. Moreover, because a trim etch is not necessary, the selection of materials for the mandrel is not limited to materials compatible with the trim etch. In addition, a spacer etch can advantageously be avoided. It will be appreciated that a spacer etch can round the top edges of a spacer. Such rounding can be undesirable as it, e.g., effectively reduces the aspect ratio of the spacers and/or encourages an uneven distribution of etchants or other materials during application of etchants or other material to any layers underlying the spacers. Advantageously, spacers formed according the preferred embodiments can have a more uniform, square shape. Moreover, a spacer etch can be more aggressive and can erode underlying material to a greater extent than the removal of unreacted material in the preferred embodiments.

Reference will now be made to the Figures, wherein like numerals refer to like parts throughout. It will be appreciated that the Figures are not necessarily drawn to scale.

Initially, a sequence of layers of materials is formed to allow formation of spacers over a substrate.

Figure 2:
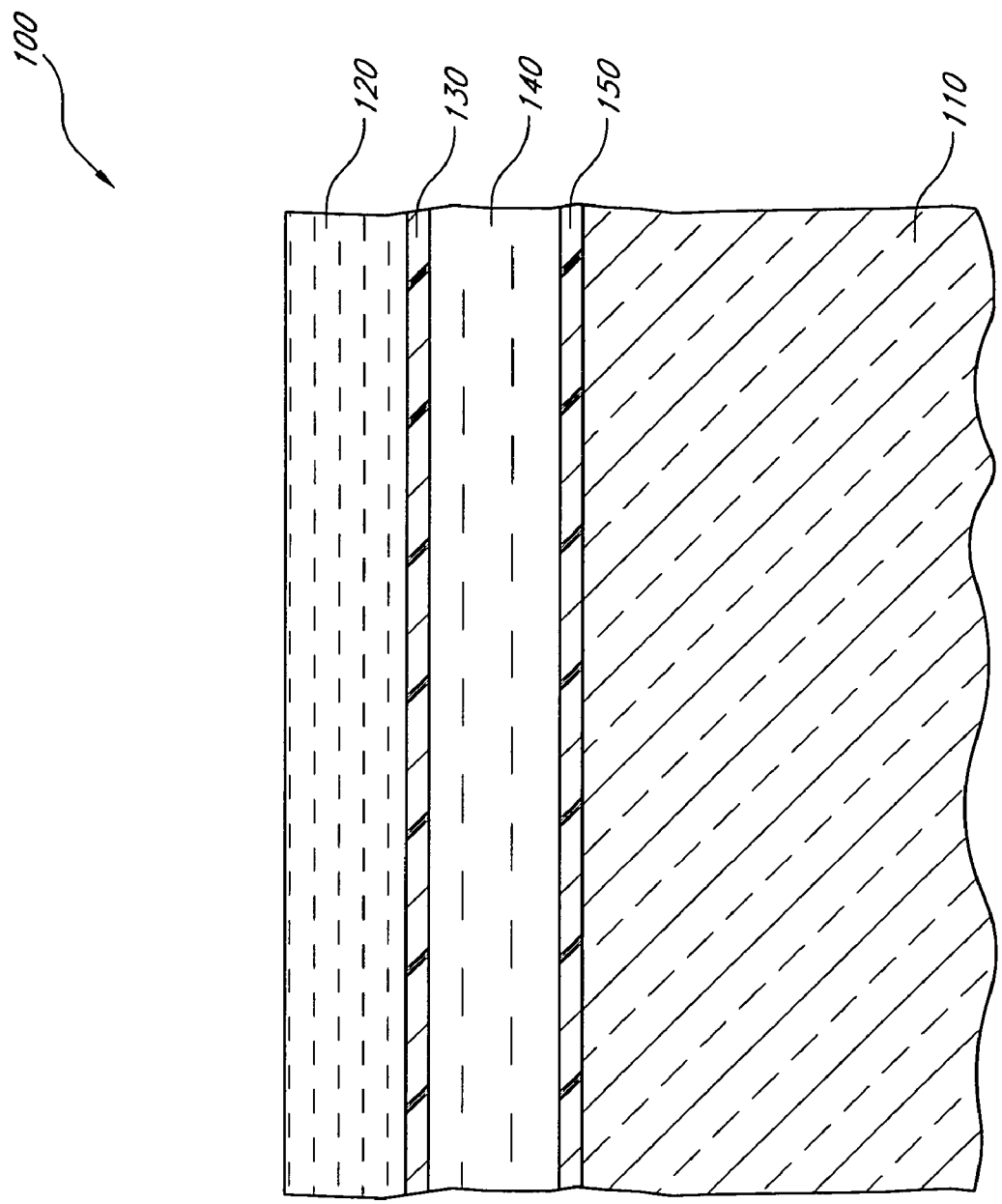
FIG. 2 is a schematic cross-sectional side view of a partially formed integrated circuit, in accordance with preferred embodiments of the invention.

FIG. 2 shows a cross-sectional side view of a partially formed integrated circuit 100. While the preferred embodiments can be used to form any integrated circuit, they are particularly advantageously applied to forming devices having repeating patterns or arrays of electrical devices, including memory cell arrays for volatile and non-volatile memory devices such as DRAM, phase change RAM, programmable conductor (PCRAM), ROM or flash memory, including NAND flash memory, or integrated circuits having logic or gate arrays. For example, the logic array can be a field programmable gate array (FPGA) having a core array similar to a memory array and a periphery with supporting logics. Consequently, the integrated circuit 100 can be, e.g., a memory chip or a processor, which can include both a logic array and embedded memory, or any other integrated circuit having a logic or a gate array.

With continued reference to FIG. 2, various masking layers 120-150 are preferably provided above a substrate 110. It will be appreciated that the substrate 160 can be a silicon wafer or any structure or layer of material overlying a wafer. For example, the substrate 100 can comprise an insulating film.

The layers 120-150 will be etched to form a mask for patterning the substrate 110, as discussed below. Materials for the layers 120-150 are preferably chosen based upon consideration of the chemistry and process conditions for the various pattern forming and pattern transferring steps discussed herein. Because the layers between a topmost selectively definable layer 120 and the substrate 110 preferably function to transfer a pattern derived from the selectively definable layer 120 to the substrate 110, the layers 130-150 between the selectively definable layer 120 and the substrate 110 are preferably chosen so that they can be selectively etched relative to other exposed materials at various stages, as described below. It will be appreciated that a material is considered selectively, or preferentially, etched when the etch rate for that material is at least about 5 times greater, preferably at least about 10 times greater, more preferably at least about 20 times greater and, most preferably, at least about 40 times greater than that for surrounding materials. Because a goal of the layers 120-150 overlying the substrate 110 is to allow well-defined patterns to be formed in that substrate 110, it will be appreciated that one or more of the layers 120-150 can be omitted or substituted if suitable other materials, chemistries and/or process conditions are used. For example, an antireflective coating can be formed between the layers 120 and 130 in some embodiments where the resolution enhancement properties of such a layer are desired. In other embodiments, discussed further below, additional masking layers can be added between the layer 150 and the substrate 110 to form a mask having improved etch selectivity relative to the substrate 110. Optionally, if appropriate etch chemistries are available, the layer 150 can be omitted and the spacers 175 (FIG. 10) can be used as a mask to, e.g., pattern the substrate without any intervening materials. Exemplary materials for the various layers discussed herein include silicon oxide, silicon nitride, silicon, amorphous carbon, dielectric antireflective coatings (DARC, silicon rich silicon oxynitride), and organic bottom antireflective coatings (BARC), each of which can be selectively etched relative to at least 2 or 3 of the other materials, depending upon the application.

In addition to selecting appropriate materials for the various layers, the thicknesses of the layers 120-150 are preferably chosen depending upon compatibility with the etch chemistries and process conditions described herein. For example, when transferring a pattern from an overlying layer to an underlying layer by selectively etching the underlying layer, materials from both layers are removed to some degree. Preferably, the upper layer is thick enough so that it is not worn away over the course of the pattern transfer.

The selectively definable layer 120 preferably overlies a hard mask layer 130, which preferably can function as a cap layer to shield mandrels 145 (FIG. 5) from reactive agents, as discussed below. The layer 130 overlies a mandrel layer 140, which overlies a second hard mask, or etch stop, layer 150, which overlies the substrate 110 to be processed (e.g., etched) through a mask. The selectively definable layer 120 is preferably photodefinable, e.g., formed of a photoresist, including any photoresist known in the art. For example, the photoresist can be any photoresist compatible with 157 nm, 193 nm, 248 nm or 365 nm wavelength systems, 193 nm wavelength immersion systems, extreme ultraviolet systems (including 13.7 nm wavelength systems) or electron beam lithographic systems. In addition, maskless lithography, or maskless photolithography, can be used to define the selectively definable layer 120. Examples of preferred photoresist materials include argon fluoride (ArF) sensitive photoresist, i.e., photoresist suitable for use with an ArF light source, and krypton fluoride (KrF) sensitive photoresist, i.e., photoresist suitable for use with a KrF light source. ArF photoresists are preferably used with photolithography systems utilizing relatively short wavelength light, e.g., 193 nm. KrF photoresists are preferably used with longer wavelength photolithography systems, such as 248 nm systems. In other embodiments, the layer 120 and any subsequent resist layers can be formed of a resist that can be patterned by nano-imprint lithography, e.g., by using a mold or mechanical force to pattern the resist.

The material for the hard mask layer 130 preferably comprises an inorganic material. Exemplary materials include, without limitation, silicon oxide and silicon nitride. In the illustrated embodiment, the hard mask layer 130 comprises silicon nitride. The mandrel layer 140 is preferably formed of a material that can be converted into a spacer material, which in turn offers good etch selectivity relative to the unreacted mandrel material, the hard mask layer 130 and material underlying the spacer material. In the illustrated embodiment, the mandrel material is silicon.

Figure 11:
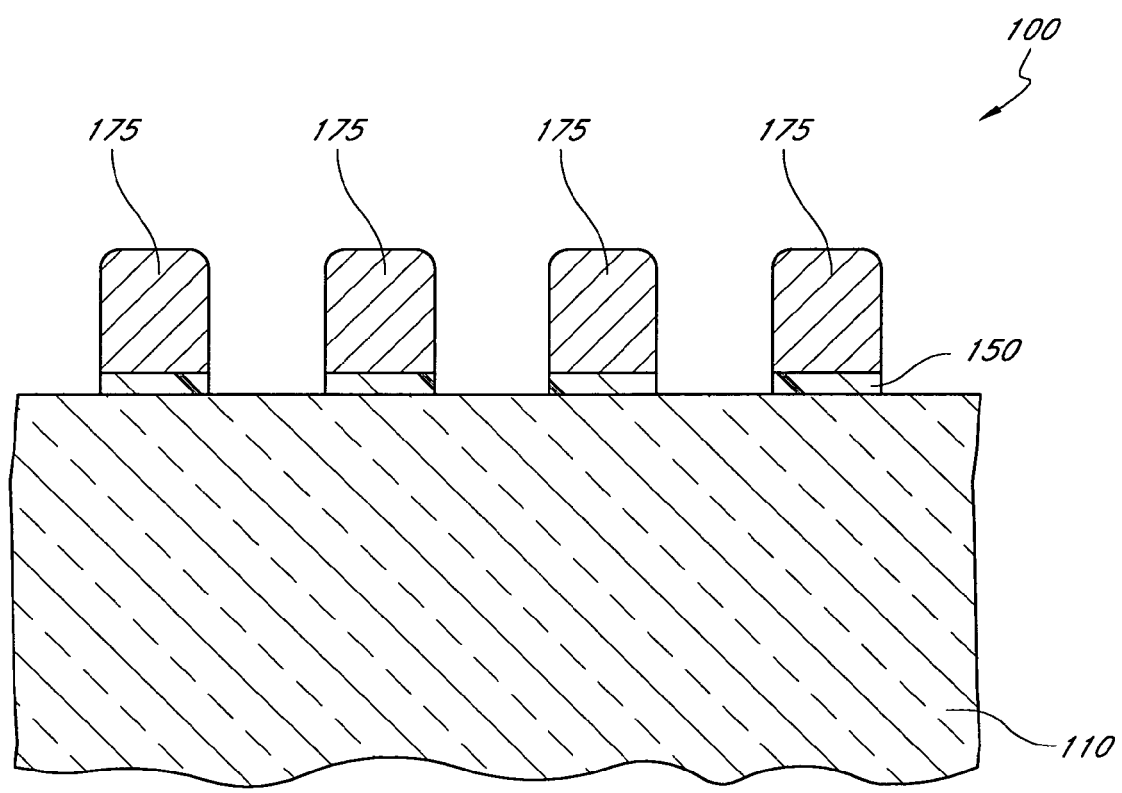
FIG. 11 is a schematic, cross-sectional side view of the partially formed integrated circuit of FIG. 10 after transferring a pattern formed by the spacers to a hard mask layer underlying the spacers, in accordance with preferred embodiments of the invention.
Figure 12:
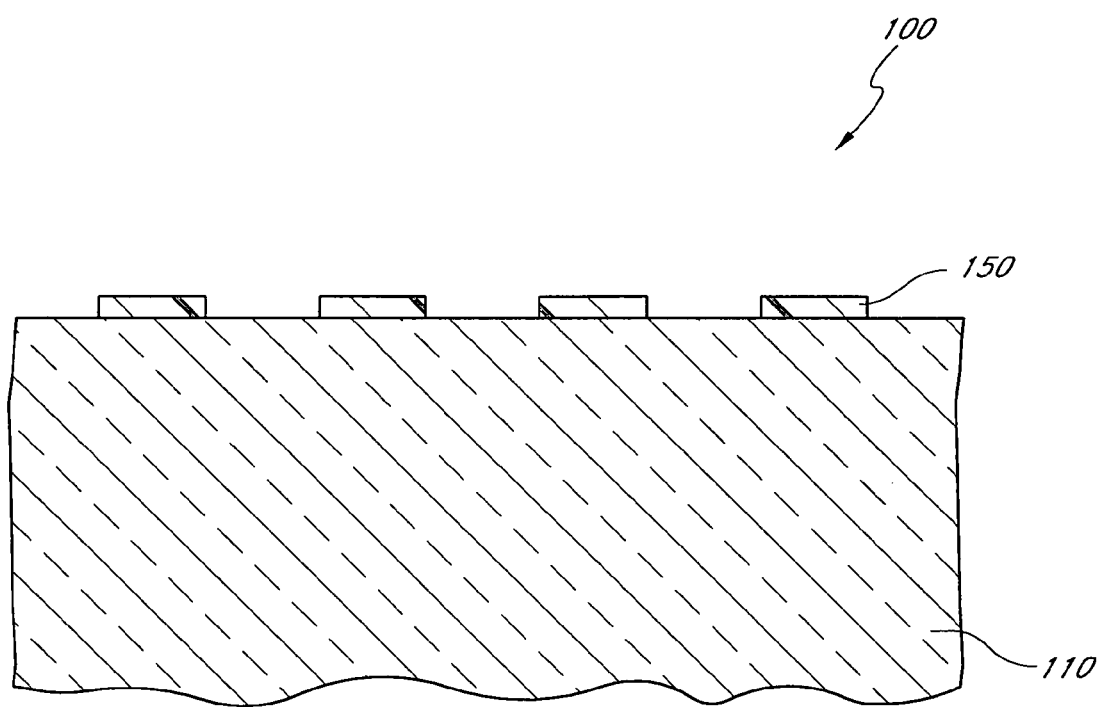
FIG. 12 is a schematic, cross-sectional side view of the partially formed integrated circuit of FIG. 11 after removing the spacers, in accordance with preferred embodiments of the invention.

The material for the second hard mask layer 150 is preferably chosen based upon the material used for the spacers 175 (FIG. 11) and for the underlying substrate 110. Where the layer 150 is used as a mask to etch the substrate 110, the layer 150 is preferably formed of a material that is resistant to the desired processing (e.g., etching, doping, oxidizing, etc.) of the substrate 110 to be conducted through the mask and can be selectively etched relative to the spacers 175 (FIG. 11). For example, the second hard mask layer 150 can be a nitride, e.g., silicon nitride, or can be an oxide, e.g., silicon oxide. In the illustrated embodiment, the second hard mask layer 150 comprises silicon oxide.

The various layers discussed herein can be formed by various methods known in the art. For example, spin-on-coating processes can be used to form photodefinable layers, BARC, and spin-on dielectric oxide layers. Various vapor deposition processes, such as sputtering, chemical vapor deposition (CVD) and/or atomic layer deposition (ALD), can be used to form various hard mask, cap and mandrel layers. In addition, some layers, e.g., the layer 140, can be reacted to form other layers. For example, rather than depositing a silicon nitride layer using silicon and nitrogen precursors, the top surface of the silicon layer 140 can be nitrided using a nitrogen precursor to form a silicon nitride layer, which can serve as a hard mask layer, or a cap layer for the subsequently produced mandrel (as will be better understood in view of the discussion below).

Having formed a desired stack of layers, a pattern of spacers is next formed.

Figure 3:
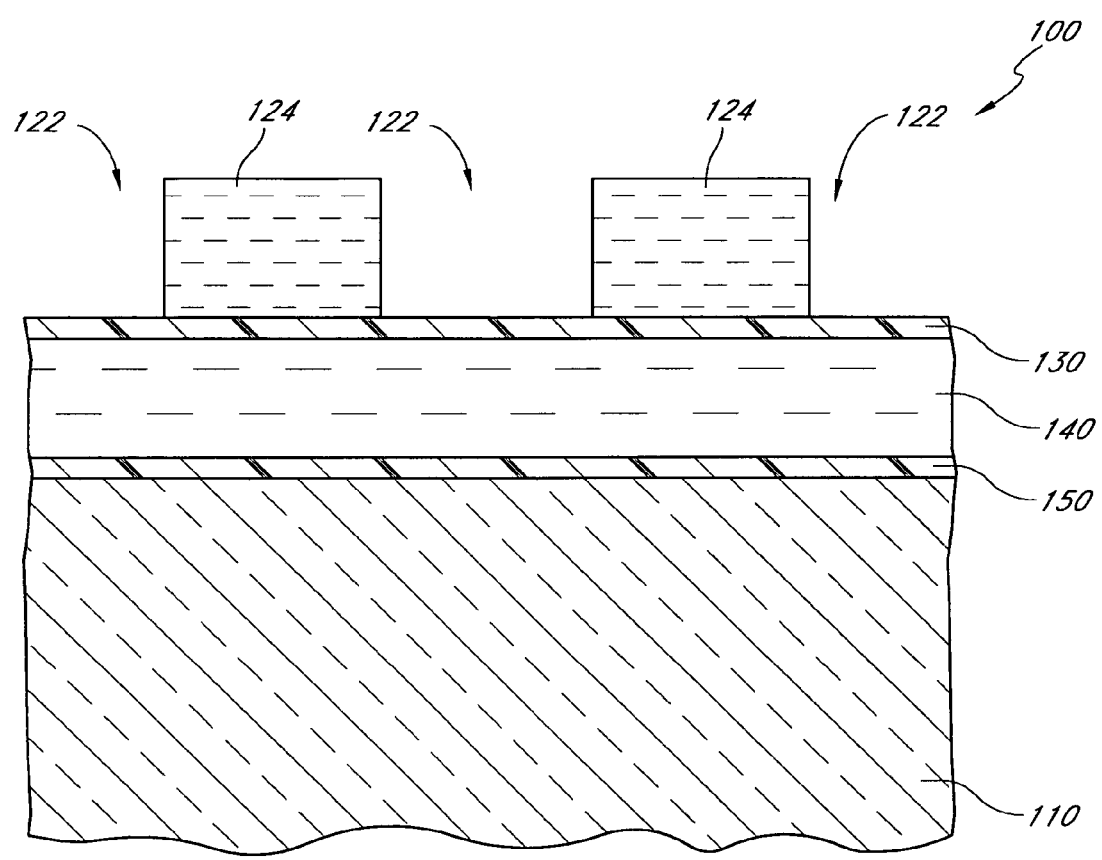
FIG. 3 is a schematic cross-sectional side view of the partially formed integrated circuit of FIG. 2 after forming features in a photoresist layer, in accordance with preferred embodiments of the invention.

With reference to FIG. 3, a pattern comprising spaces or trenches 122, which are delimited by features 124 formed of photodefinable material, is formed in the photodefinable layer 120. The trenches 122 can be formed by, e.g., photolithography with 248 nm or 193 nm light, in which the layer 120 is exposed to radiation through a reticle and then developed. The remaining photodefined material forms mask features such as the illustrated lines 124 (shown in cross-section only) after being developed. Advantageously, the lines 124 can be formed having widths of about 120 nm or less, or about 80 nm or less, to form spacers having a pitch of about 100 nm or less.

Figure 4:
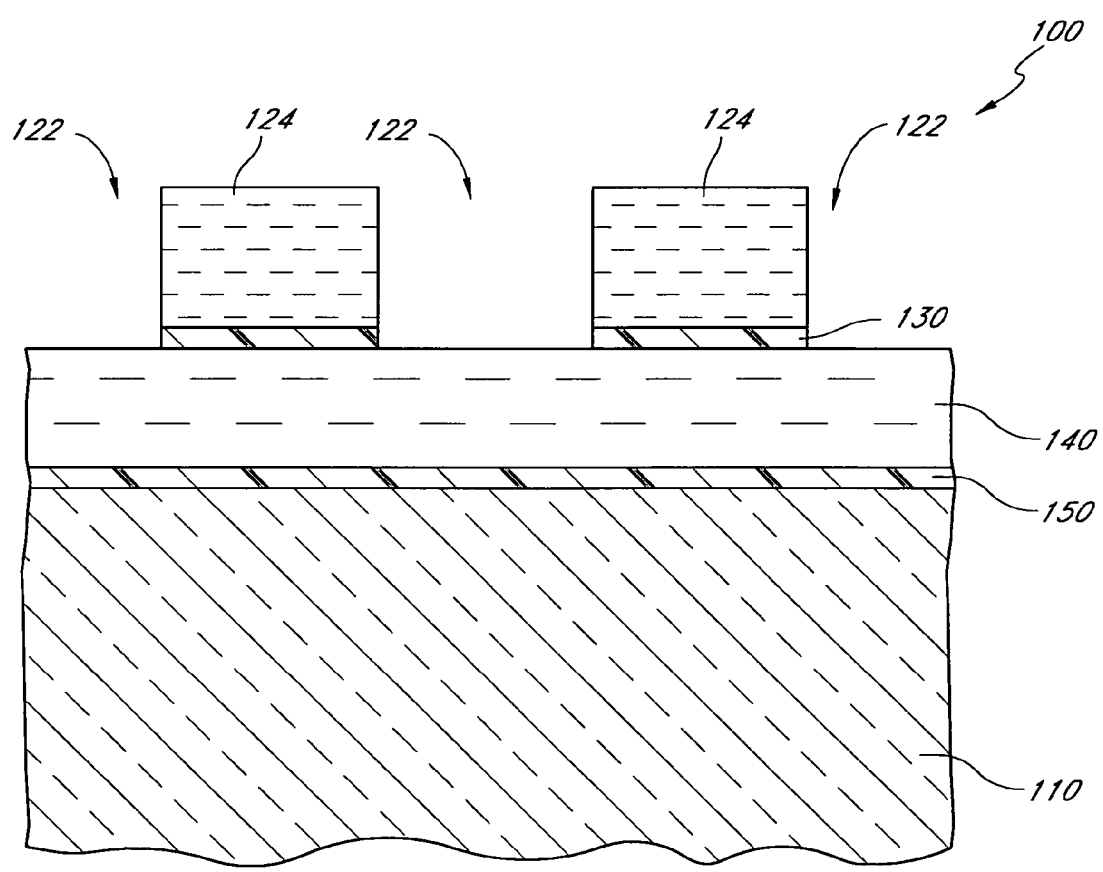
FIG. 4 is a schematic, cross-sectional side view of the partially formed integrated circuit of FIG. 3 after etching through a hard mask layer, in accordance with preferred embodiments of the invention.

With reference to FIG. 4, the pattern of photoresist features 124 and trenches 122 is transferred to the hard mask layer 130. This transfer is preferably accomplished using an anisotropic etch, such as an etch using a $CF_4$, $CF_4/H_2$, $CF_4/O_2$, $SF_6$ or $NF_3$-containing plasma, although a wet (isotropic) etch may also be suitable if the hard mask layer 130 is sufficiently thin to be etched through without undesirably widening spaces in the transferred pattern.

Figure 5:
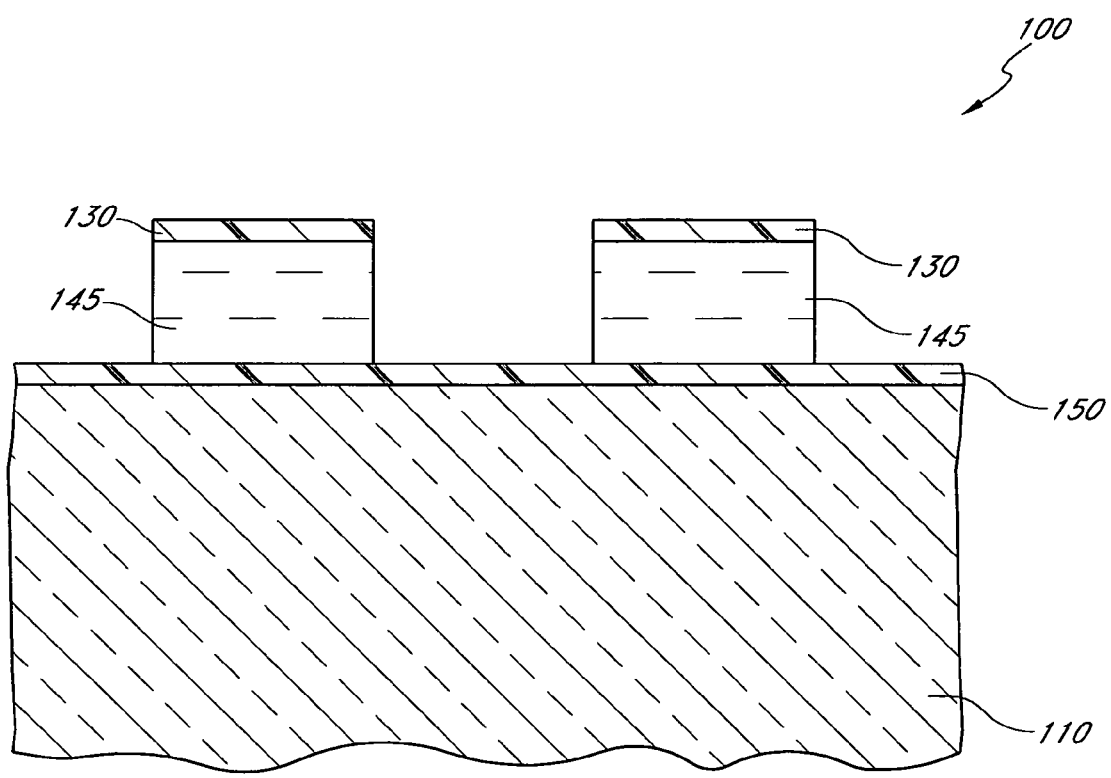
FIG. 5 is a schematic, cross-sectional side view of the partially formed integrated circuit of FIG. 4 after transferring a pattern from the hard mask layer to a layer of mandrel material to form a pattern of mandrels in the temporary layer, in accordance with preferred embodiments of the invention.

With reference to FIG. 5, the pattern in the photodefinable layer 120 and the hard mask layer 130 is transferred to the mandrel layer 140 to form mandrels, or temporary placeholders, 145. The transfer is preferably accomplished using an anisotropic etch employing, e.g., HBr/HCl or $CHCl_3/Cl_2$-containing plasma. The widths of the mandrels 145 are preferably substantially similar to the widths of the lines 124, e.g., the mandrels 145 preferably have a width of about 120 nm of less, or about 80 nm or less.

Figure 6:
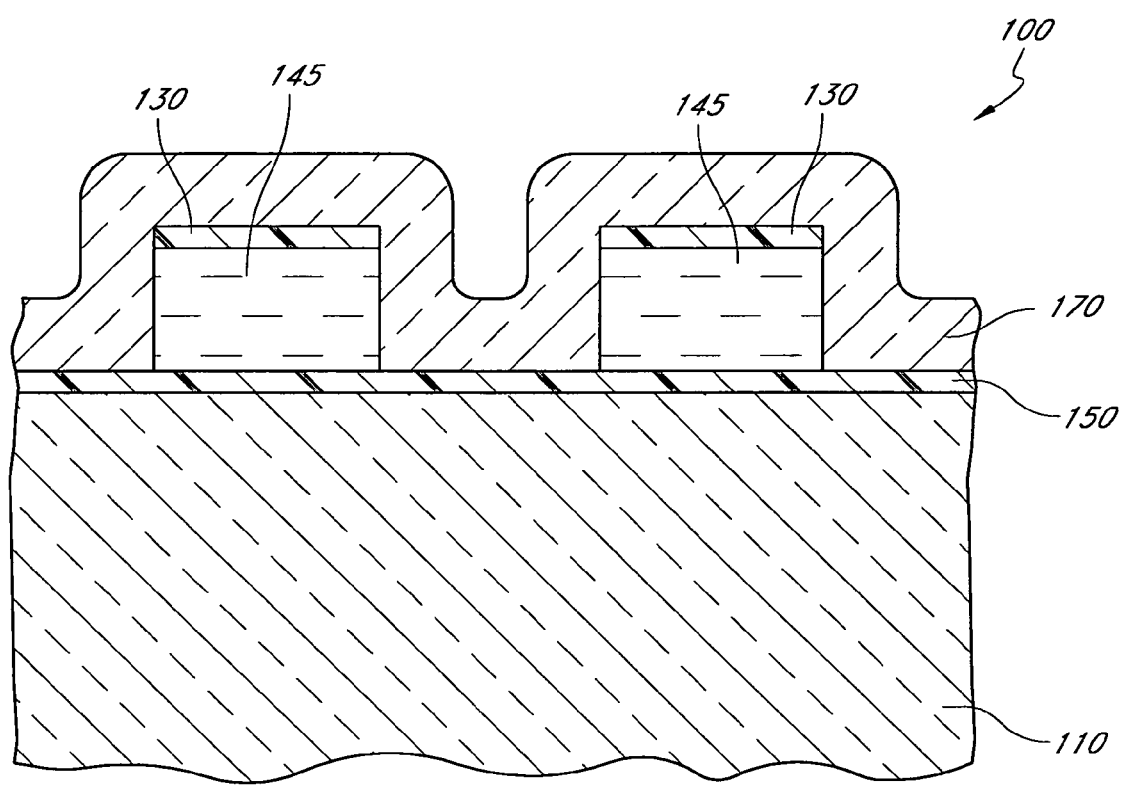
FIG. 6 is a schematic, cross-sectional side view of the partially formed integrated circuit of FIG. 5, after depositing a layer of a pre-spacer material, in accordance with preferred embodiments of the invention.

With reference to FIG. 6, pre-spacer material, i.e., material to be reacted to form spacers, is deposited on the sidewalls of the mandrels 145. Preferably, the pre-spacer material is blanket deposited as a layer 170 on the mandrels 145. In the illustrated embodiment, the pre-spacer material that forms the layer 170 is titanium. The deposition can be accomplished by various methods known in the art, including, e.g., CVD and ALD. The thickness of the layer 170 is preferably chosen to provide sufficient material to form spacers 175 (FIG. 7) of the desired width after reaction of the pre-spacer material 170 with the mandrels 145, as discussed below.

Figure 7:
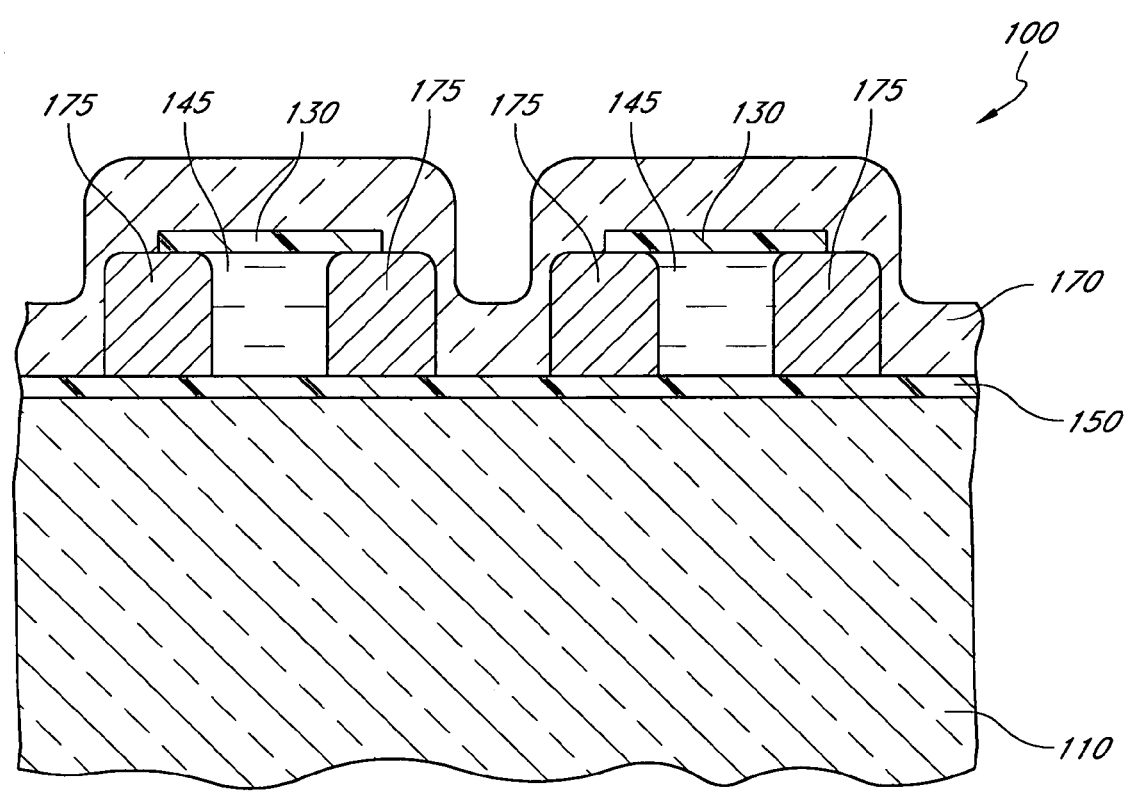
FIG. 7 is a schematic, cross-sectional side view of the partially formed integrated circuit of FIG. 6 after reacting the layer of the pre-spacer material to form spacers on the mandrel sidewalls, in accordance with preferred embodiments of the invention.

With reference to FIG. 7, the titanium pre-spacer layer 170 and the mandrels 145 are next reacted with one another to form spacers 175, composed of a titanium silicide in the illustrated embodiment. It will be appreciated that the mandrels 145 are preferably provided with a cap layer to focus the reaction on the sidewalls of the mandrels 145. In the illustrated embodiment, the hard mask layer 130 preferably acts as the cap layer to prevent the top of the mandrels 145 from being reacted, by preventing contact between the titanium pre-spacer layer 170 and the top surface of the mandrels 145. In other embodiments, the cap layer can be separately formed, e.g., by deposition on or reaction of the top of the mandrels 145, whether or not the hard mask layer 130 is present.

Preferably, the layer 170 and the mandrels 145 are subjected to an elevated temperature, e.g., an anneal, to cause a self-aligned silicidation reaction. For example, the partially fabricated integrated circuit 100 can be subjected to rapid thermal processing (RTP) at a temperature of about 550-800° C., more preferably, about 650-680° C., for about 5-90 seconds, more preferably, about 20-60 seconds.

It will be appreciated that the extent of the reaction and the amount of titanium in the layer 170 that reacts with the silicon of the mandrels 145 is related to the temperature and duration of the anneal. Thus, advantageously, reaction conditions, such as the temperature and duration of the anneal, can be selected depending upon the width and/or separation distance desired for the spacers 175. For example, the mandrels 145 and the layer 170 can be reacted until the separation is about 80 nm or less or, more preferably, about 50 nm or less.

In other embodiments, the parts of the titanium layer 170 at the sidewalls of the mandrels 145 are preferably fully reacted. Advantageously, fully reacting these parts allows for a larger process window for the anneal and good control over the widths of the spacers 175, since the thickness of the layer 170 typically places a limit on the maximum width of the spacers 175 formed by the reaction. For example, by depositing the layer 170 to a given width, the duration and/or temperature of the anneal can be allowed to exceed the duration and/or temperature needed to form spacers 175 of that width, since the amount of material (e.g., the width) of the layer 170 typically limits the growth of the spacers 175, particularly in the direction of the layer 170.

Figure 8:
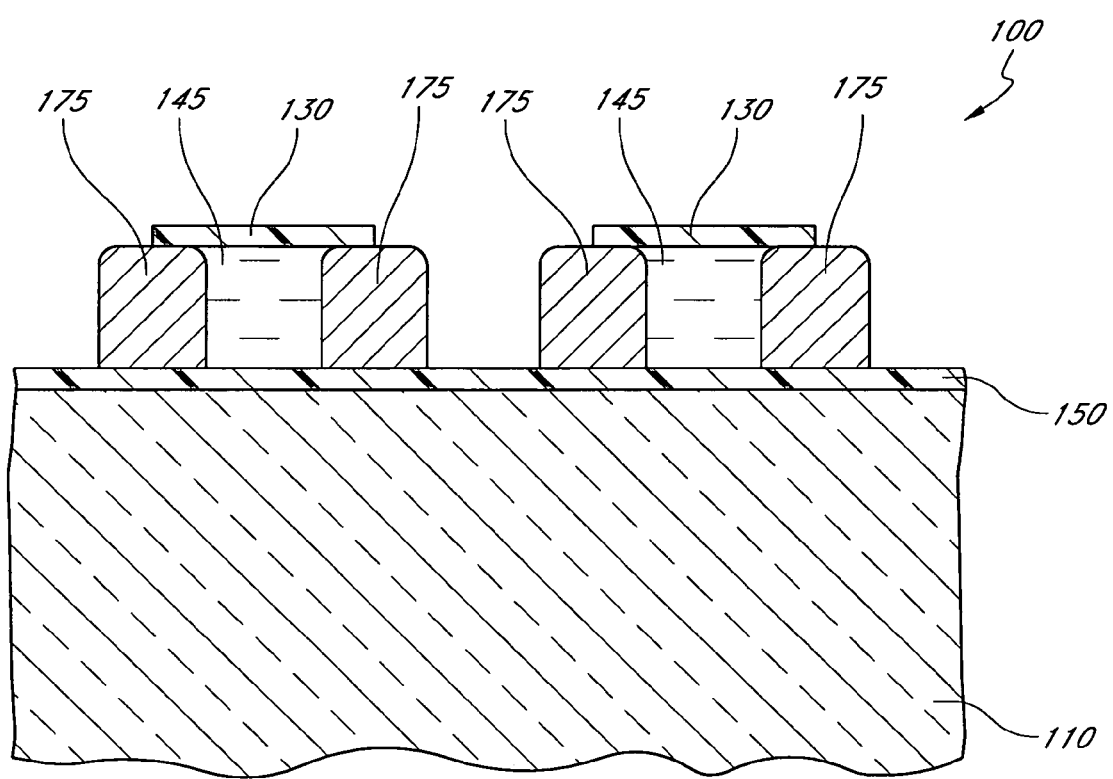
FIG. 8 is a schematic, cross-sectional side view of the partially formed integrated circuit of FIG. 7 after selectively removing unreacted pre-spacer material, in accordance with preferred embodiments of the invention.

With reference to FIG. 8, unreacted titanium in the layer 170 is selectively removed to leave the spacers 175 at the sides of the mandrels 145. The removal can be accomplished by wet or dry etches. A wet etch can have advantages for reduced costs and less damage to the structure of the spacers 175. An example of a suitable etch is a wet etch comprising $H_2O$, $H_2O_2$ and $NH_4OH$. Preferably, the spacers 175 are sublithographic, i.e., they have a critical dimension, e.g., width, that is below the resolution limit of the photolithographic technique used for forming the spacer pattern, in this case, the photolithographic technique used to pattern the layer 120.

Figure 9:
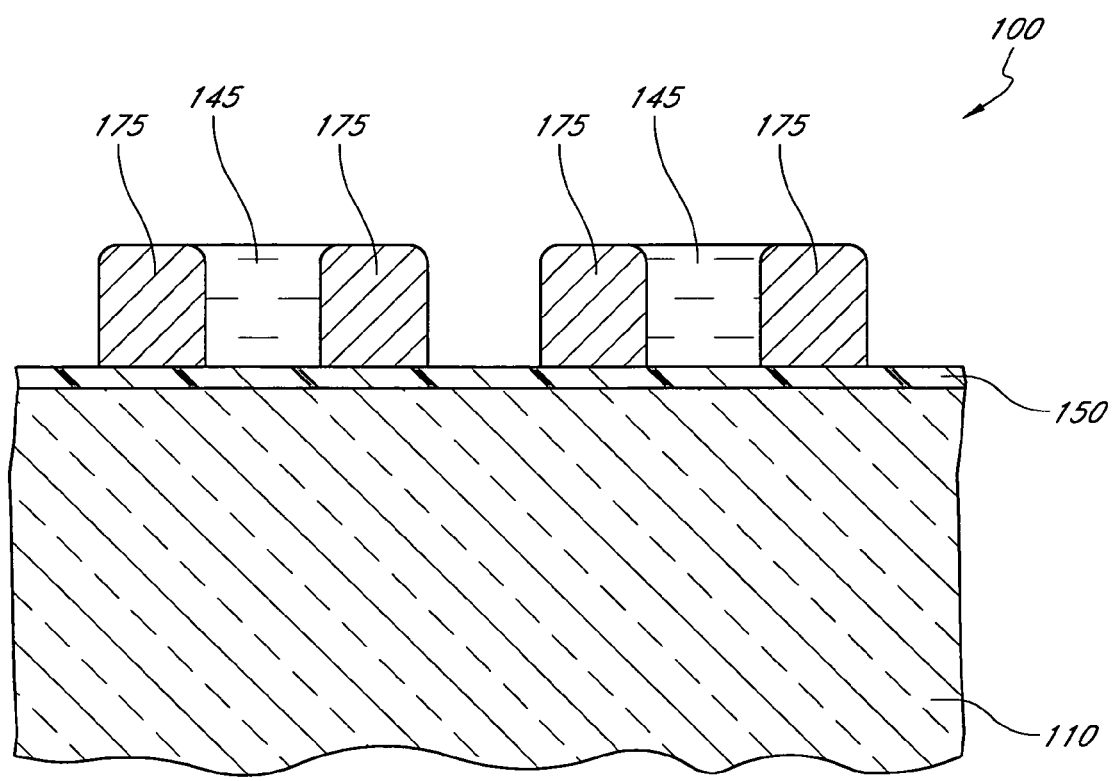
FIG. 9 is a schematic, cross-sectional side view of the partially formed integrated circuit of FIG. 8 after removing a hard mask layer, in accordance with preferred embodiments of the invention.

With reference to FIG. 9, the silicon nitride cap layer 130 is selectively removed relative to the spacers 175. This removal can be accomplished using a dry etch or a wet etch, e.g., using hot phosphoric acid.

Figure 10:
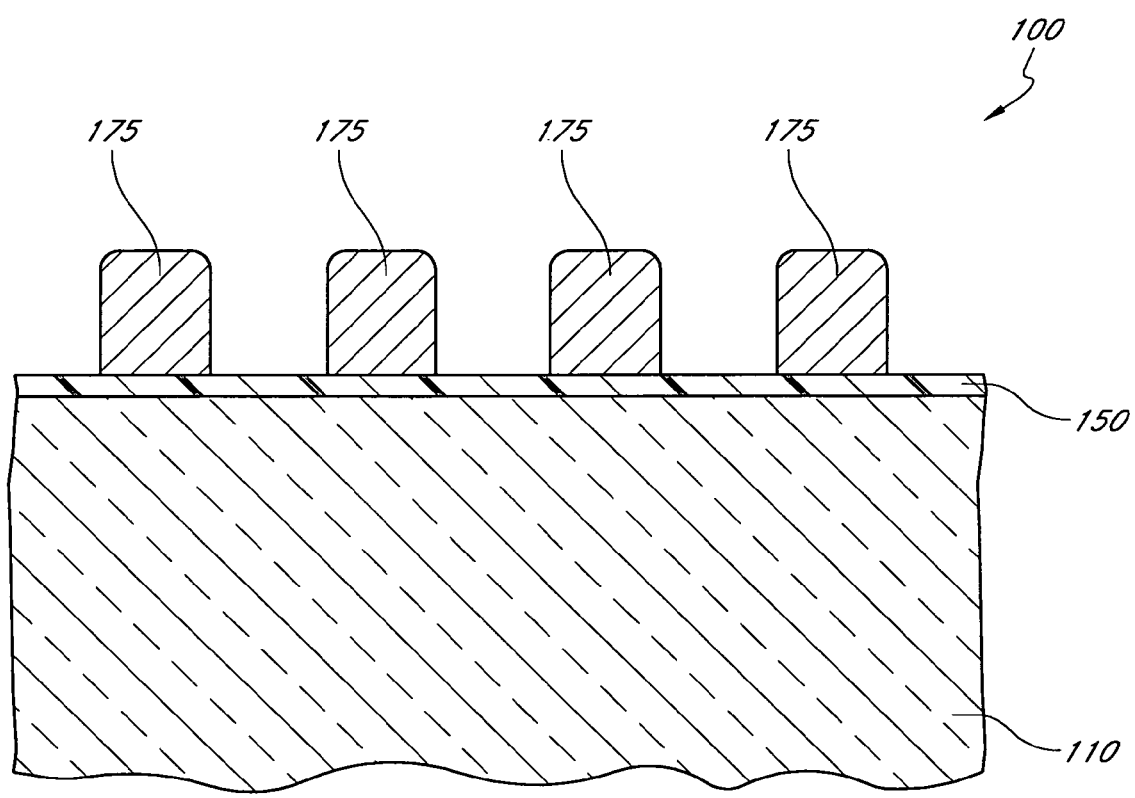
FIG. 10 is a schematic, cross-sectional side view of the partially formed integrated circuit of FIG. 9 after selectively removing unreacted mandrel material, in accordance with preferred embodiments of the invention.

Next, as shown in FIG. 10, unreacted mandrel material is selectively removed to form a pattern of free-standing spacers 175. Dry or wet etches can be employed for this removal. An exemplary wet etch comprises HF, $HNO_3$ and $H_2O$. A hard mask layer 150 can be provided underlying the spacers 175, to protect the substrate 110 and to allow unreacted mandrel material to be removed without unintentionally removing material in the substrate 110. Thus, advantageously, the spacers 175 can be formed having a pitch that is roughly half that of the photoresist lines 124 and spaces 122 (FIG. 3) originally formed by photolithography. Where the photoresist lines 124 had a pitch of about 200 nm, spacers 175 having a pitch of about 100 nm or less can be formed.

It will be appreciated that because the spacers 175 are formed in the sidewalls of the mandrels 145, the spacers 175 generally follow the outline of the mandrels 145 and, so, typically form a closed loop. It will be appreciated that where the pitch multiplied pattern is used to form features such as conductive lines, additional processing steps can be used to cut off or otherwise prevent transfer of the pattern at the ends of these loops, so that each loop forms two individual, non-connected lines. This can be accomplished, for example, by depositing a layer of a protective material over the loops, patterning the protective layer to form a protective mask around the parts of the lines to be maintained, and then etching away the unprotected parts, e.g., the ends, of the loops. A suitable method for cutting off the ends of the loops is disclosed in U.S. patent application Ser. No. 10/931,771 to Tran et al., filed Aug. 31, 2004, the entire disclosure of which is incorporated be reference herein.

With reference to FIG. 11, in addition to protecting the substrate 110 during a spacer removal, the hard mask layer 150 preferably allows for improved etch selectivity relative to the substrate 110, in cases where the pattern of spacers 175 is to be transferred to the substrate 110. As discussed above, the hard mask layer 150 is formed of silicon oxide in the illustrated embodiment. The pattern of spacers 175 is preferably transferred to the layer 150 using an anisotropic etch, e.g., an etch containing $CHF_3$, $CF_4$ or $C_2F_6$ plasma. If the hard mask layer 150 is sufficiently thin, it will be appreciated that a wet etch may also be used to accomplish the pattern transfer with minimal undercutting.

Next, the hard mask layer 150 can be used to pattern the underlying substrate 110.

It will be appreciated that the spacers 175 can be removed before or after etching the substrate 110. Preferably, where the material of the hard mask layer 150 offers good etch selectivity relative to the material of the substrate 110, e.g., where the spacers 175 are not needed to supplemental the hard mask layer 150, the spacers 175 can be removed before the pattern is transferred to the substrate 110. The spacer removal can be accomplished using, e.g., a dilute HF wet etch. Advantageously, the spacer removal reduces the aspect ratio of the spaces through which processing is conducted, e.g., through which etchants must travel to reach the substrate 110 and minimizes the possibility of alterations in the pattern caused by collapse or deformation of the spacers 175, especially where the spacers 175 are very tall and/or narrow. Thus, as shown in FIG. 11, the spacers 175 can be removed to facilitate the etch of the substrate.

Figure 13:
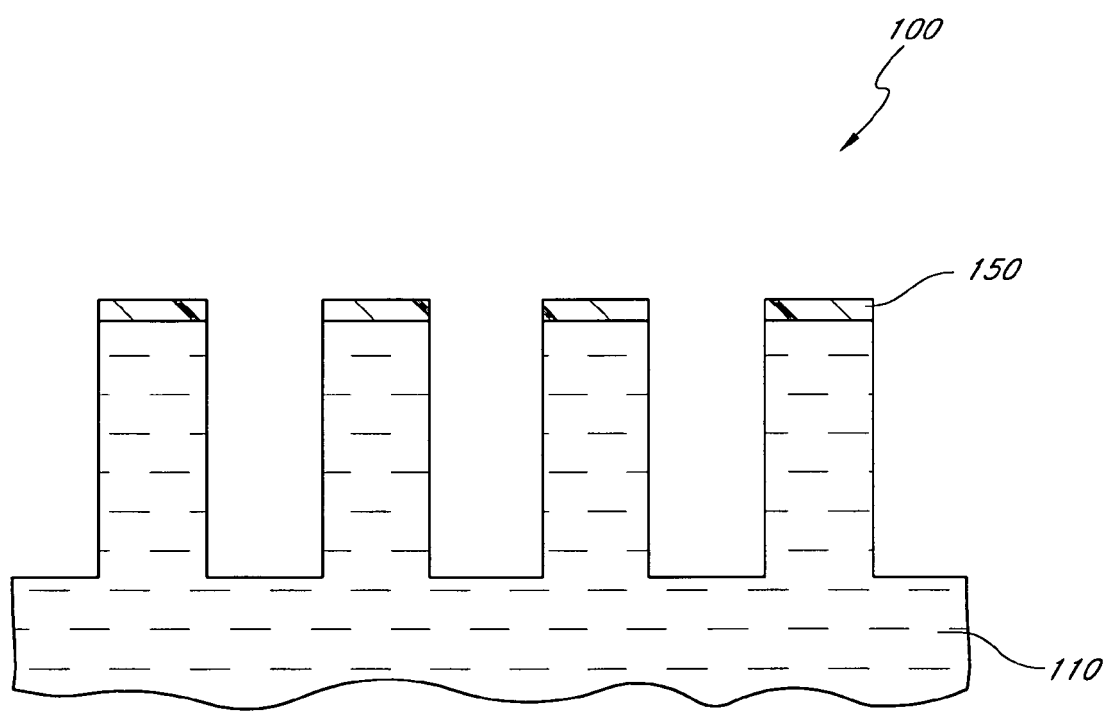
FIG. 13 is a schematic, cross-sectional side view of the partially formed integrated circuit of FIG. 12 after transferring the pattern in the masking layer to an underyling substrate, in accordance with preferred embodiments of the invention

With reference to FIG. 13, the pattern in the hard mask layer 150 can be transferred to the substrate 110 using, e.g., an etch or combination of etches selective for the material(s) of the substrate 110. In addition to etching the substrate through masks, in other embodiments, other types of processing through the mask in the layer 150 are also possible. Non-limiting examples of other processes include implantation, diffusion doping, lift-off patterned deposition, oxidation, nitridation, etc.

Figure 14:
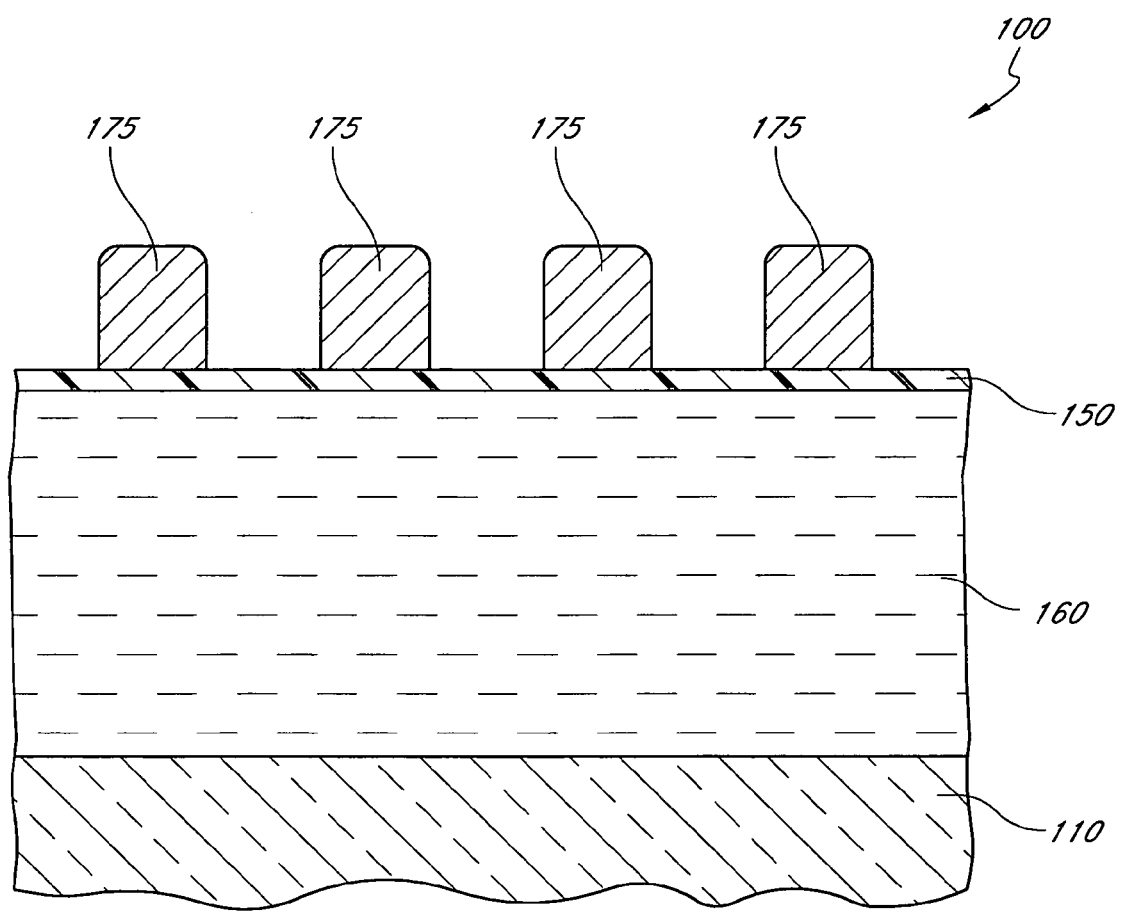
FIG. 14 is a schematic, cross-sectional side view of a partially formed integrated circuit having hard a mask and additional masking layers disposed between the spacers and the substrate, in accordance with preferred embodiments of the invention.

With reference to FIG. 14, in other embodiments, especially where the substrate 110 is difficult to etch or where prolonged processing through the mask is desired, one or more additional intervening layers of masking material can be formed between the spacers 175 and the substrate 110. For example, an additional layer 160 can be provided, as discussed in co-pending U.S. Patent Provisional Application No. 60/662,323 to Tran et al., filed Mar. 15, 2005, entitled Pitch Reduced Patterns Relative To Photolithography Features, (Micron Ref. No. 2004-1130,00/US), the entire disclosure of which is incorporated herein by reference.

With continued reference to FIG. 14, the layer 150 preferably comprises a material that has good etch selectively relative to the spacers 175, the layer 160 and the mandrels 145 (FIG. 9). The layer 160 is preferably formed of amorphous carbon, which is advantageously resistant to many etch chemistries for removing silicon materials in the substrate 110.

Figure 15:
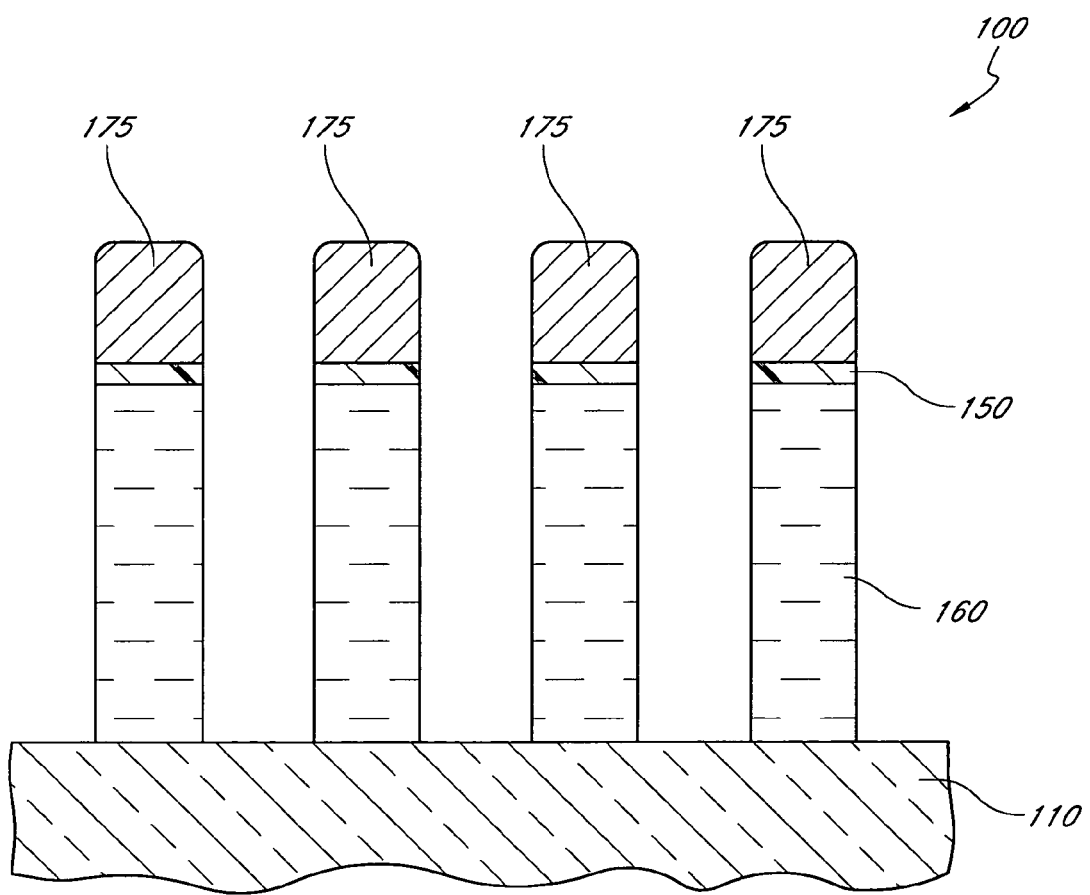
FIG. 15 is a schematic, cross-sectional side view of the partially formed integrated circuit of FIG. 14 after transferring the spacer pattern into the additional masking layers and an underyling substrate, in accordance with preferred embodiments of the invention.

With reference to FIG. 15, the pattern defined by the spacers 175 can be transferred to the layer 160, which then serves as the primary mask 160 for patterning the substrate 110. Advantageously, in other embodiments, due to the availability of extreme selectivity when etching amorphous carbon, a patterned hard mask layer 150 can be used to transfer the pattern from the layer 150 to the layer 160 after removal of the spacers 175, so that the mask used to transfer the pattern to the primary masking layer 160 has lower and more uniform aspect ratio features. In other embodiments, in conjunction with suitable other materials, the hard mask layer 150 can itself be formed of amorphous carbon.

In yet other embodiments, there may be no intervening layers, e.g., no hard mask layer 150, between the substrate 110 and the spacers 175. In such cases, especially where the spacer material has good etch selectivity relative to the substrate, the substrate 110 can be processed through the pattern of spacers 175 without any intervening hard mask layers.

It will be appreciated that the formation of spacers according to the preferred embodiments offers numerous advantages. For example, a mandrel trim etch is not necessary and the spacer non-uniformities that can be caused by such a trim etch can be eliminated. Instead, deposition of the pre-spacer layer 170 and the extent of a spacer formation reaction, e.g., an anneal, determine both the spacer width and the spacer spacing. Moreover, because a trim etch is not performed, the range of materials that can be used to form mandrels may be expanded, as requirements for compatibility with trim etches is removed. Thus, processing flexibility can be increased. In addition, a directional spacer etch is not necessary, allowing advantages with respect to forming spacers 175 with symmetrically shaped shoulders and to minimizing damage to underlying layers.

While a spacer etch is advantageously not necessary in the preferred embodiments, in some arrangements, a spacer etch can be performed on the layer 170 of pre-spacer material to form spacer features, formed of pre-spacer material, on the sides of the mandrels before reacting the pre-spacer material and the mandrel material. These spacer features can then be reacted with the mandrel material to form the spacers 175, which are selectively etchable relative to the mandrel material and underlying materials.

It will also be appreciated that, while discussed with reference to particular processing steps and materials in the illustrated embodiment, various modifications are possible. For example, various silicides in addition to titanium silicide can be used to form the spacers. Examples of other metals to form metal silicides include tantalum, hafnium, and nickel. In the example above, these metals can be deposited over the mandrels and annealed to form a metal silicide. In other arrangements, the combination of materials can be reversed. For example, the mandrels 145 can be metallic and a silicon layer is deposited over the mandrels to form a metal silicide. In addition, the mandrels 145 can comprise amorphous carbon and the layer 170 can comprise various other materials reactive with amorphous carbon. For example, the layer 170 can comprise silicon to form silicon carbide spacers 175, or the layer 170 can comprise a metal to form a metal carbide.

Figure 16:
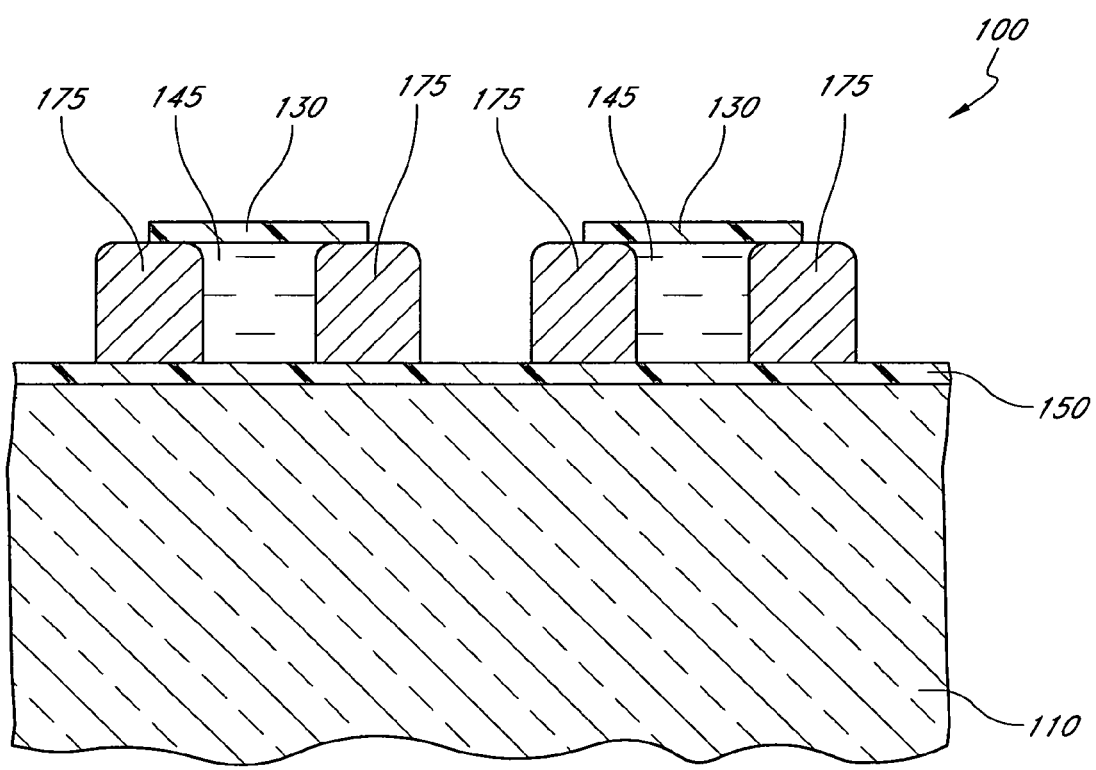
FIG. 16 is a schematic, cross-sectional side view of the partially formed integrated circuit of FIG. 5 after forming spacers on sides of the mandrels by a gas phase reaction, in accordance with some preferred embodiments of the invention.

With reference to FIG. 16, it will be appreciated that while the formation of the spacers 175 is illustrated as a solid state reaction in which a deposited metal layer reacts with the mandrels, the spacers 175 can be formed by various processes other than reactions between solid state reactants. In some embodiments, the mandrels 145 can be reacted with a gaseous reactant to form spacers, including spacers that are not suicides. For example, a silicidation of a silicon mandrel 145 can be accomplished by exposing the mandrels 145 to a gaseous metal reactant (e.g., $TiCl_4$, $WF_6$, etc.), or a gas phase silicidation of a metal mandrel 145 can be accomplished by exposing the mandrels 145 to a gaseous silicon reactant (e.g., $SiH_4$). In addition, silicon oxide spacers can be formed by exposing silicon mandrels to an oxidant or, where the cap layer is a suitable material other than silicon nitride, silicon nitride can be formed by exposing silicon mandrels to a reactive nitrogen species. In other embodiments, the mandrels 145 can be a carbon species, such as amorphous carbon, resist, or carbon-doped materials (e.g., as disclosed in U.S. Pat. No. 6,515,355, the entire disclosure of which is incorporated by reference herein) which is converted to a polymer or cross-linked to form spacers 175. The conversion can be caused by exposure to energy (e.g., light) or other agents (e.g., catalysts). After the spacers 175 are formed, the partially fabricated integrated circuit 100 can be processed as discussed above regarding FIGS. 9-15.

Additionally, while two materials are discussed above for ease of illustration and description, it will be appreciated that more than two materials can be reacted to form a desired spacer material, e.g., $SiO_xN_y$ formed by a reaction with gas phase reactants. These additional materials can be reacted by, e.g., forming depositing multiple layers of pre-spacer materials over one another and then performing an anneal and/or by depositing a single layer of pre-spacer material, performing an anneal to react that layer with the mandrel material and then depositing one or more additional layers of pre-spacer material and then performing an anneal. In other embodiments, the additional materials can be introduced as gaseous reactants as an alternative to or in additional to depositing layers of pre-spacer material.

Moreover, while trim etches are preferably not performed in the formation of the mandrels, a trim etch can be performed if desired. For example, the photoresist layer can be subjected to a trim etch after being developed, and/or the mandrels can be subjected to a trim etch. Such a trim etch may be useful to form spacers that are exceptionally close to together.

Additionally, the cap layer can be formed after forming the mandrels. For example, the tops of the mandrels may be reacted with directionally applied reactants, e.g., in a process similar to ion implantation, to form the cap layer.

Moreover, the spacers are formed without a cap layer for the mandrels. For example, a metal layer can be conformally deposited over the mandrels and both the top and sides of the mandrels can be reacted. The reacted top parts can them be removed, e.g., by a directional dry etch or by filling the empty spaces between the mandrels with a filler material, performing chemical mechanical polishing to remove the top parts and then removing the filler material.

As with the spacers, it will also be appreciated that other materials can be used for the various other layers and parts discussed herein. Preferably, any other materials that may be used offer the appropriate etch selectivity relative to the materials that are exposed during the selective etch steps, as discussed above. Moreover, the substrate 110 can comprise different materials, e.g., layers of different materials, or different materials in different lateral regions of the substrate. To transfer the pattern defined by the spacers to such a substrate, a succession of different chemistries, preferably dry-etch chemistries, can be used to successively etch through these different materials, if a single chemistry is not sufficient to etch all the different materials.

It will also be appreciated that, depending upon the chemistry or chemistries used, overlying spacers and hard mask layers may be etched. In some cases, the additional masking layer 160 (FIG. 14) is preferably used for superior etch selectivity. Using amorphous carbon for the primary mask layer 160 advantageously offers excellent resistance to conventional etch chemistries, especially those used for etching silicon-containing materials. Thus, the primary mask layer 160 can effectively be used as a mask for etching through a plurality of substrate layers, or for forming high aspect ratio trenches.

Also, the masks discussed herein can be used to form various integrated circuit features, including, without limitation, conductive interconnect lines, landing pads and parts of various electrical devices, such as capacitors and transistors, particularly for memory and logic arrays, or flat panel displays, in which dense repeating patterns are desirable. As such, while illustrated as lines with regular spacing and regular widths for ease of illustration, the masks can have features with variable spacing. Also, while illustrated with spacers formed on a single level, in other embodiments, spacers can be formed on multiple vertical levels and consolidated on a single level to form a mask pattern.

In addition, the pitch of the pattern formed in the photoresist layer 120 can be more than doubled. For example, the pattern can be further pitch multiplied by using the spacers 175 as mandrels for a conventional pitch multiplication process in which additional spacers are formed around the spacers 175, then the spacers 175 are removed, then spacers are formed around the spacers that were formerly around the spacers 175, and so on.

The preferred embodiments can also be employed multiple times throughout an integrated circuit fabrication process to form features in a plurality vertical levels, which may be vertically contiguous or non-contiguous and vertically separated. In such cases, each of the individual levels to be patterned would constitute a substrate 110. In addition, some of the preferred embodiments can be combined with other of the preferred embodiments, or with other masking methods known in the art, to form features on different areas of the same substrate 110 or on different vertical levels.

Accordingly, it will be appreciated by those skilled in the art that these and various other omissions, additions and modifications may be made to the methods and structures described above without departing from the scope of the invention. All such modifications and changes are intended to fall within the scope of the invention, as defined by the appended claims.

We claim:

1. A method for forming an integrated circuit, comprising:
defining a pattern in a selectively definable layer over a substrate;
transferring the pattern from the selectively definable layer to an underlying layer of temporary material to form a plurality of temporary placeholders in the layer of temporary material across a region over the substrate;
providing a cap layer on a top horizontal surface of the temporary placeholders, wherein the cap layer inhibits reactions on the top horizontal surface and exposes sidewalls of the temporary placeholders;
blanket depositing a layer comprising a solid phase reactant over the cap layer and the temporary placeholders;
converting some of the temporary material into an other material to form a plurality of spacers underneath the cap layer, the spacers forming a plurality of mask features, wherein converting some of the temporary material comprises selectively reacting sidewalls of the temporary placeholders with the solid phase reactant, wherein at least part of the spacers are formed directly under the cap layer, the cap layer and the spacers formed of different materials;
selectively removing the cap layer relative to the spacers;
selectively removing unconverted temporary material between the spacers after removing the cap layer; and
subsequently etching the substrate through a mask pattern defined by the plurality of spacers.

2. The method of claim 1, wherein the blanket deposition comprises a chemical vapor deposition.

3. The method of claim 1, wherein the blanket deposition comprises an atomic layer deposition.

4. The method of claim 1, wherein converting some of the temporary material comprises reacting a portion of the layer comprising the solid phase reactant with the temporary material.

5. The method of claim 4, further comprising preferentially removing an unreacted remainder of the layer.

6. The method of claim 1, wherein the solid phase reactant comprises a metal and the other material comprises a metal silicide.

7. The method of claim 6, wherein the metal is selected from the group consisting of tantalum, hafnium, and nickel.

8. The method of claim 1, wherein selectively reacting sidewalls of the temporary placeholders comprises exposing the sidewalls to a gas phase reactant.

9. The method of claim 8, wherein the gas phase reactant is selected from the group consisting of a nitrogen and an oxygen-containing species.

10. The method of claim 1, wherein defining the pattern comprises performing photolithography.

11. The method of claim 10, wherein defining the pattern comprises performing photolithography utilizing 193 nm or 248 nm wavelength light.

12. The method of claim 1, wherein transferring the pattern comprises performing an anisotropic etch.

13. The method of claim 1, wherein selectively removing unconverted temporary material comprises performing a wet etch.

14. The method of claim 1, wherein the spacers extend in spaced, generally parallel relation to one another at least between first and second spaced planes extending perpendicular to the spacers.

15. The method of claim 1, wherein the temporary placeholders comprise silicon.

* * * * *